(12) United States Patent
Ebata et al.

(10) Patent No.: US 9,039,944 B2
(45) Date of Patent: May 26, 2015

(54) SPUTTERING TARGET

(75) Inventors: Kazuaki Ebata, Sodegaura (JP);
Shigekazu Tomai, Sodegaura (JP); Kota Terai, Sodegaura (JP); Shigeo Matsuzaki, Sodegaura (JP); Koki Yano, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 0 days.

(21) Appl. No.: 14/130,857

(22) PCT Filed: Jun. 28, 2012

(86) PCT No.: PCT/JP2012/004196
§ 371 (c)(1),
(2), (4) Date: Jan. 3, 2014

(87) PCT Pub. No.: WO2013/005400
PCT Pub. Date: Jan. 10, 2013

(65) Prior Publication Data
US 2014/0145185 A1 May 29, 2014

(30) Foreign Application Priority Data

Jul. 6, 2011 (JP) ................................. 2011-150317

(51) Int. Cl.
*H01L 21/283* (2006.01)
*H01L 29/788* (2006.01)
(Continued)

(52) U.S. Cl.
CPC .......... *H01L 21/02565* (2013.01); *C01G 15/00* (2013.01); *H01B 1/08* (2013.01); *C23C 14/08* (2013.01); *C23C 14/3414* (2013.01); *H01L 29/7869* (2013.01); *C04B 35/01* (2013.01);
(Continued)

(58) Field of Classification Search
None
See application file for complete search history.

(56) References Cited

U.S. PATENT DOCUMENTS 7,008,519 B2 * 3/2006 Takahashi et al. ....... 204/192.23
2004/0231981 A1 11/2004 Takahashi et al.
(Continued)

FOREIGN PATENT DOCUMENTS

JP 07-315930 A 12/1995
JP 07-330431 A 12/1995
(Continued)

OTHER PUBLICATIONS

Moriga, Toshihiro, Takashi Sakamoto, Yoshiki Sato, Azrul Hisham Khalid @ Haris, Ryoichi Suenari, and Ichiro Nakabayashi. "Crystal Structures and Electrical and Optical Properties of MgIn2—xGaxO4Solid Solutions." Journal of Solid State Chemistry 142.1 (1999): 206-13.*

(Continued)

*Primary Examiner* — Matthew Reames
*Assistant Examiner* — Joseph Schoenholtz
(74) *Attorney, Agent, or Firm* — Foley & Lardner LLP

(57) ABSTRACT

A sputtering target including a sintered body including In, Ga and Mg,
the sintered body including one or more compounds selected from a compound represented by $In_2O_3$, a compound represented by $In(GaMg)O_4$, a compound represented by $Ga_2MgO_4$ and a compound represented by $In_2MgO_4$, and
having an atomic ratio In/(In+Ga+Mg) of 0.5 or more and 0.9999 or less and an atomic ratio (Ga+Mg)/(In+Ga+Mg) of 0.0001 or more and 0.5 or less.

14 Claims, 11 Drawing Sheets

(51) Int. Cl.
| | |
|---|---|
| C23C 14/08 | (2006.01) |
| C23C 14/34 | (2006.01) |
| H01L 21/02 | (2006.01) |
| C01G 15/00 | (2006.01) |
| H01B 1/08 | (2006.01) |
| H01L 29/786 | (2006.01) |
| C04B 35/01 | (2006.01) |
| C04B 35/626 | (2006.01) |
| H01L 27/12 | (2006.01) |

(52) U.S. Cl.
CPC ..... *C04B 35/6261* (2013.01); *C04B 2235/3206* (2013.01); *C04B 2235/3232* (2013.01); *C04B 2235/3244* (2013.01); *C04B 2235/3286* (2013.01); *C04B 2235/3287* (2013.01); *C04B 2235/3293* (2013.01); *C04B 2235/3418* (2013.01); *C04B 2235/5436* (2013.01); *C04B 2235/5445* (2013.01); *C04B 2235/604* (2013.01); *C04B 2235/6562* (2013.01); *C04B 2235/6565* (2013.01); *C04B 2235/6567* (2013.01); *C04B 2235/6584* (2013.01); *C04B 2235/6585* (2013.01); *C04B 2235/664* (2013.01); *C04B 2235/77* (2013.01); *C04B 2235/80* (2013.01); *C04B 2235/963* (2013.01); *C23C 14/081* (2013.01); *C23C 14/086* (2013.01); *H01L 21/02631* (2013.01); *H01L 27/1225* (2013.01)

(56) References Cited

U.S. PATENT DOCUMENTS

| | | |
|---|---|---|
| 2007/0194379 A1 | 8/2007 | Hosono et al. |
| 2010/0127256 A1 | 5/2010 | Inoue et al. |
| 2011/0006299 A1 | 1/2011 | Abe et al. |
| 2011/0050733 A1* | 3/2011 | Yano et al. .................. 345/690 |

FOREIGN PATENT DOCUMENTS

| | | | |
|---|---|---|---|
| JP | 07330431 A | * 12/1995 | ............ C04B 35/495 |
| JP | 08-245220 A | 9/1996 | |
| JP | 08-264022 A | 10/1996 | |
| JP | 2003-105532 A | 4/2003 | |
| JP | 2004-149883 A | 5/2004 | |
| JP | 2005-307269 A | 11/2005 | |
| JP | 2007-073312 A | 3/2007 | |
| JP | 2008-311342 A | 12/2008 | |
| JP | 2010-070409 A | 4/2010 | |
| JP | 2010-219538 A | 9/2010 | |
| JP | 2011-035376 A | 2/2011 | |
| WO | WO 2008/139860 A1 | 11/2008 | |
| WO | WO 2009/008297 A1 | 1/2009 | |
| WO | WO 2009-084537 A1 | 7/2009 | |
| WO | WO 2010/058533 A1 | 5/2010 | |

OTHER PUBLICATIONS

Minami, Tadatsugu, Toshihiro Miyata, Hidenobu Toda, and Shingo Suzuki. "In2O3 Based Multicomponent Oxide Transparent Conducting Films Prepared by R.F. Magnetron Sputtering." MRS Proceedings 623 (2000).*

Medvedeva, J. E. "Unconventional Approaches to Combine Optical Transparency with Electrical Conductivity." Applied Physics A 89.1 (2007).*

Written Opinion of International Search Authority date of mailing Jul. 8, 2012.*

Ueda, Naoyuki, Takahisa Omata, Naoko Hikuma, Kazushige Ueda, Hiroshi Mizoguchi, Takuya Hashimoto, and Hiroshi Kawazoe. "New Oxide Phase with Wide Band Gap and High Electroconductivity, MgIn2O4." Applied Physics Letters 61.16 (1992): 1954.*

Un'no, Hiroshi, et. al. "Preparation of MgIn2O4-x Thin Films on Glass Substrate by RF sputtering", Jpn. J. Appl. Phys. vol. 32 (1993), pp. L1260-L1262.*

Kanto Nano-Materials Data Sheet downloaded from URL< http://www.kanto.co.jp/siyaku/pdf/sozai_09.pdf > on Nov. 17, 2014.*

* cited by examiner

SPUTTERING TARGET

TECHNICAL FIELD

The invention relates to a sputtering target, a method for producing an oxide thin film using the same, a thin film transistor and a display.

In recent years, remarkable progress has been attained in displays. Various displays such as liquid crystal displays and EL displays have been actively incorporated in an OA apparatus such as a PC and a word processor. Each of these displays has a sandwich structure in which a display element is sandwiched between transparent conductive films.

Currently, a silicon-based semiconductor film has been used mainly as a switching device to drive the above-mentioned display. The reason therefor is that, in addition to improved stability and processibility of a silicon-based thin film, a thin film transistor using a silicon-based thin film has advantages such as a high switching speed. Generally, this silicon-based thin film is fabricated by the chemical vapor deposition (CVD) method.

However, in the case of an amorphous silicon-based thin film, there are disadvantages that the switching speed is relatively low and images cannot be displayed when a high-speed animation or the like are displayed. On the other hand, in the case of a crystalline silicon-based thin film, although the switching speed is relatively high, heating at a high temperature of 800° C. or higher, heating by means of a laser or the like is required, and hence, a large amount of energy and a large number of steps are required in production.

Although a silicon-based thin film exhibits superior performance as a voltage element, it encounters a problem that its properties change with the passage of time when current is flown.

In order to solve the problems, a thin film transistor using an oxide semiconductor film comprising indium oxide, zinc oxide and gallium oxide has been studied.

In general, an oxide semiconductor thin film is produced by sputtering using a target (sputtering target) comprising an oxide sintered body.

As the sputtering target, for example, a target formed of a compound having a homologous crystal structure represented by $InGaZnO_4$ or $In_2Ga_2ZnO_7$ is known (Patent Documents 1 to 3). In order to increase the sintering density (relative density), this target is required to be sintered in an oxidizing atmosphere. Since the resistance of the target is lowered by this sintering, it is required to subject the sintered target to a reduction treatment at a high temperature.

If the target is used for a long period of time, problems arise that the properties of the resulting film or the film-forming speed change largely, abnormal discharge due to abnormal growth of $In_2Ga_2ZnO_7$ or $InGaZnO_4$ occurs, a large number of particles are generated during the film formation or the like. If abnormal discharge occurs frequently, plasma discharge state may become instable, and hence, stable film formation cannot be conducted, thereby adversely affecting film properties.

As a sputtering target comprising magnesium oxide, a target comprising indium oxide, zinc oxide and magnesium oxide and a transparent conductive film is disclosed in Patent Document 4.

However, no studies have been made on a sputtering target for a semiconductor thin film comprising indium oxide, gallium oxide and magnesium oxide, and relationship between nodules and a formed compound is not clear.

RELATED ART DOCUMENTS

Patent Documents

Patent Document 1: JP-A-H8-245220
Patent Document 2: JP-A-2007-73312
Patent Document 3: WO2009/084537
Patent Document 4: JP-A-2005-307269

SUMMARY OF THE INVENTION

An object of the invention is to provide a sputtering target which can suppress abnormal discharge that occurs during formation of an oxide semiconductor film by a sputtering method and can obtain an oxide semiconductor film stably with a high degree of reproducibility.

According to the invention, the following sputtering target or the like are provided.

1. A sputtering target comprising a sintered body comprising In, Ga and Mg,
   the sintered body comprising one or more compounds selected from a compound represented by $In_2O_3$, a compound represented by $In(GaMg)O_4$, a compound represented by $Ga_2MgO_4$ and a compound represented by $In_2MgO_4$, and
   having an atomic ratio In/(In+Ga+Mg) of 0.5 or more and 0.9999 or less and an atomic ratio (Ga+Mg)/(In+Ga+Mg) of 0.0001 or more and 0.5 or less.
2. The sputtering target according to 1, wherein the atomic ratio satisfies the following relationship:
   In/(In+Ga+Mg)=exceeding 0.7 and 0.9999 or less and
   (Ga+Mg)/(In+Ga+Mg)=0.0001 or more and less than 0.3.
3. The sputtering target according to 1 or 2, wherein the relative density of the sintered body is 90% or more.
4. The sputtering target according to any of 1 to 3, wherein the sintered body further comprises a positive tetravalent metal oxide M.
5. The sputtering target according to 4, wherein the metal oxide M is one or more oxides selected from $SnO_2$, $TiO_2$, $SiO_2$, $ZrO_2$, $GeO_2$, $HfO_2$ and $CeO_2$.
6. The sputtering target according to 5 which satisfies the following atomic ratio:
   [M]/[all metals]=0.0001 to 0.20
   wherein [M] is the total of the positive tetravalent metal atoms contained in the sintered body and the [all metals] is the total of all metal atoms contained in the sintered body.
7. A method for producing the sputtering target according to 1, comprising:
   mixing indium oxide powder having an average particle size of 0.1 to 1.2 μm, gallium oxide powder having an average particle size of 0.1 to 1.2 μm and magnesium oxide powder having an average particle size of 0.1 to 1.2 μm at an atomic ratio In/((In+Ga+Mg) of 0.5 or more and 0.9999 or less and an atomic ratio (Ga+Mg)/(In+Ga+Mg) of 0.0001 or more and 0.5 or less;
   forming the resulting mixture to obtain a formed body;
   heating the resulting formed body at a heating rate of 0.1 to 2° C./min from 800° C. to a sintering temperature; and
   sintering the formed body by holding the formed body at the sintering temperature for 10 to 50 hours;
   the sintering temperature being 1200° C. to 1650° C.
8. A method for producing an oxide thin film, wherein a film is formed by a sputtering method by using the sputtering target according to any of 1 to 6.
9. The method for producing an oxide thin film according to 8, wherein the film formation by a sputtering method is conducted in an atmosphere of a mixed gas comprising rare gas atoms and at least one or more selected from water molecules, oxygen molecules and nitrous oxide molecules.

10. The method for producing an oxide thin film according to 9, wherein the film formation by a sputtering method is conducted in an atmosphere of a mixed gas comprising rare gas atoms and at least water molecules.

11. The method for producing an oxide thin film according to 10, wherein the content of water molecules in the mixed gas is 0.1% to 25% in terms of partial pressure.

12. A thin film transistor comprising an oxide thin film formed by the method according to any of 8 to 11 as a channel layer.

13. The thin film transistor according to 12 comprising a protective film which comprises $SiN_x$ on the channel layer 14. A display comprising the thin film transistor according to 12 or 13.

According to the invention, it is possible to provide a sputtering target which can suppress abnormal discharge that occurs when an oxide semiconductor film is formed by a sputtering method and can obtain an oxide semiconductor film stably with a high degree of reproducibility.

MODE FOR CARRYING OUT THE INVENTION

I. Sintered Body and Sputtering Target

Figure 1:
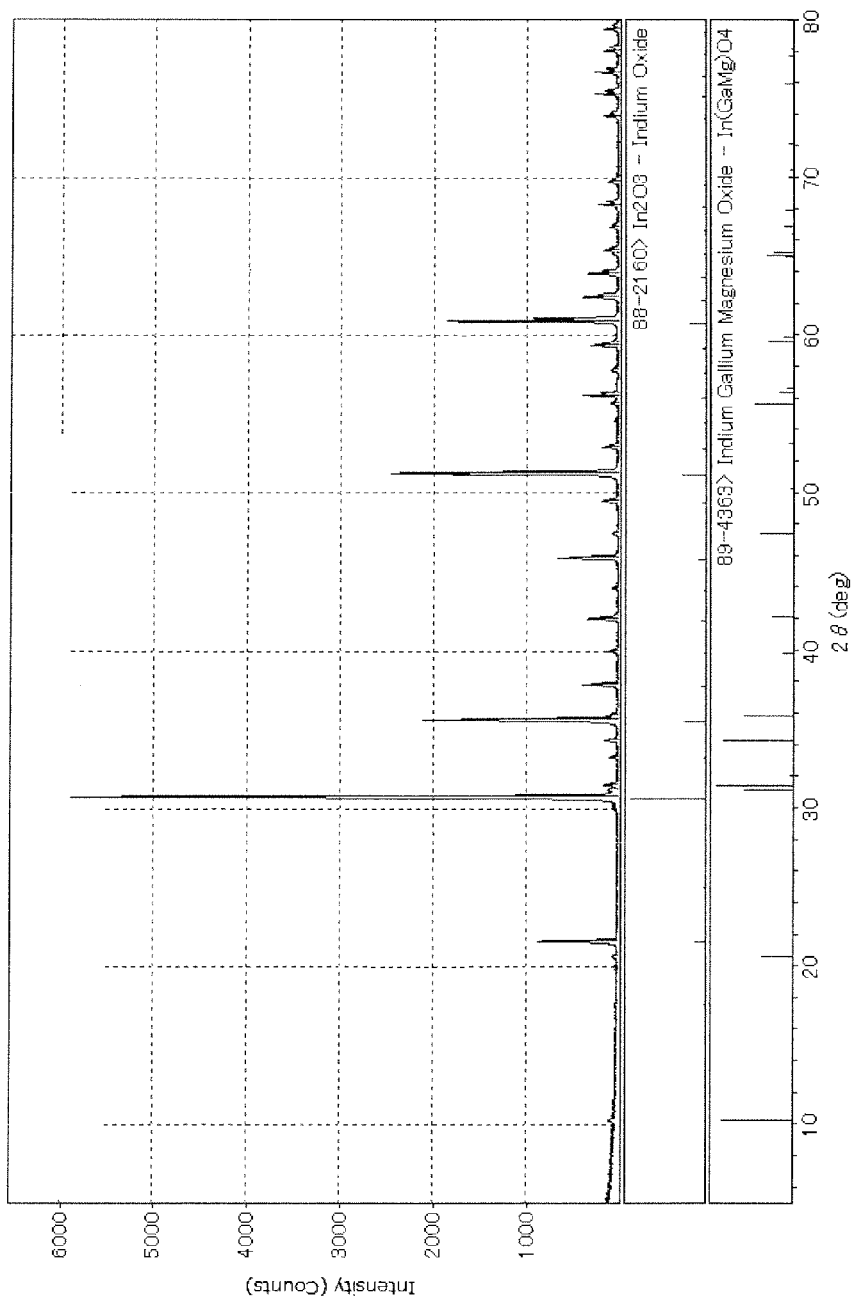
FIG. 1 is an X-ray diffraction chart of a sintered body obtained in Example 1.
Figure 2:
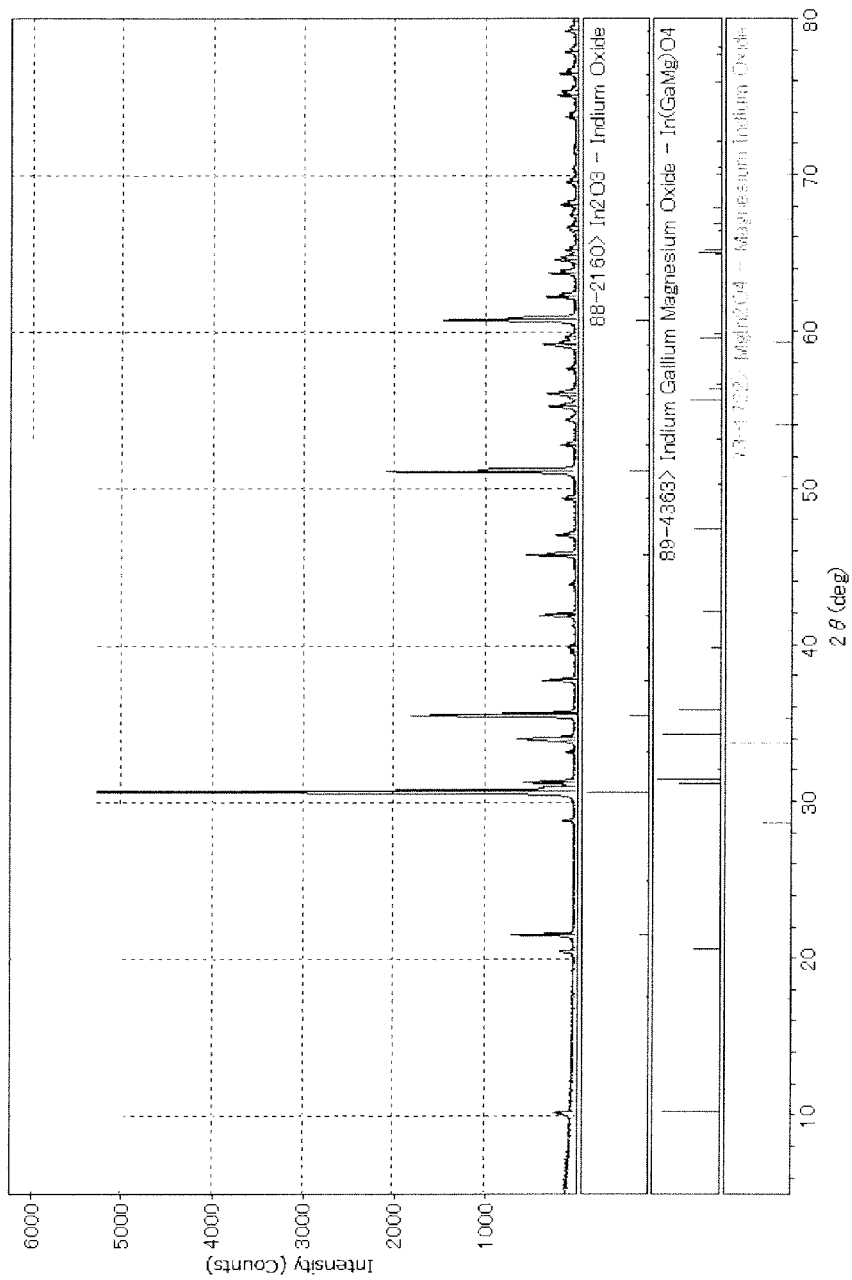
FIG. 2 is an X-ray diffraction chart of a sintered body obtained in Example 2.
Figure 3:
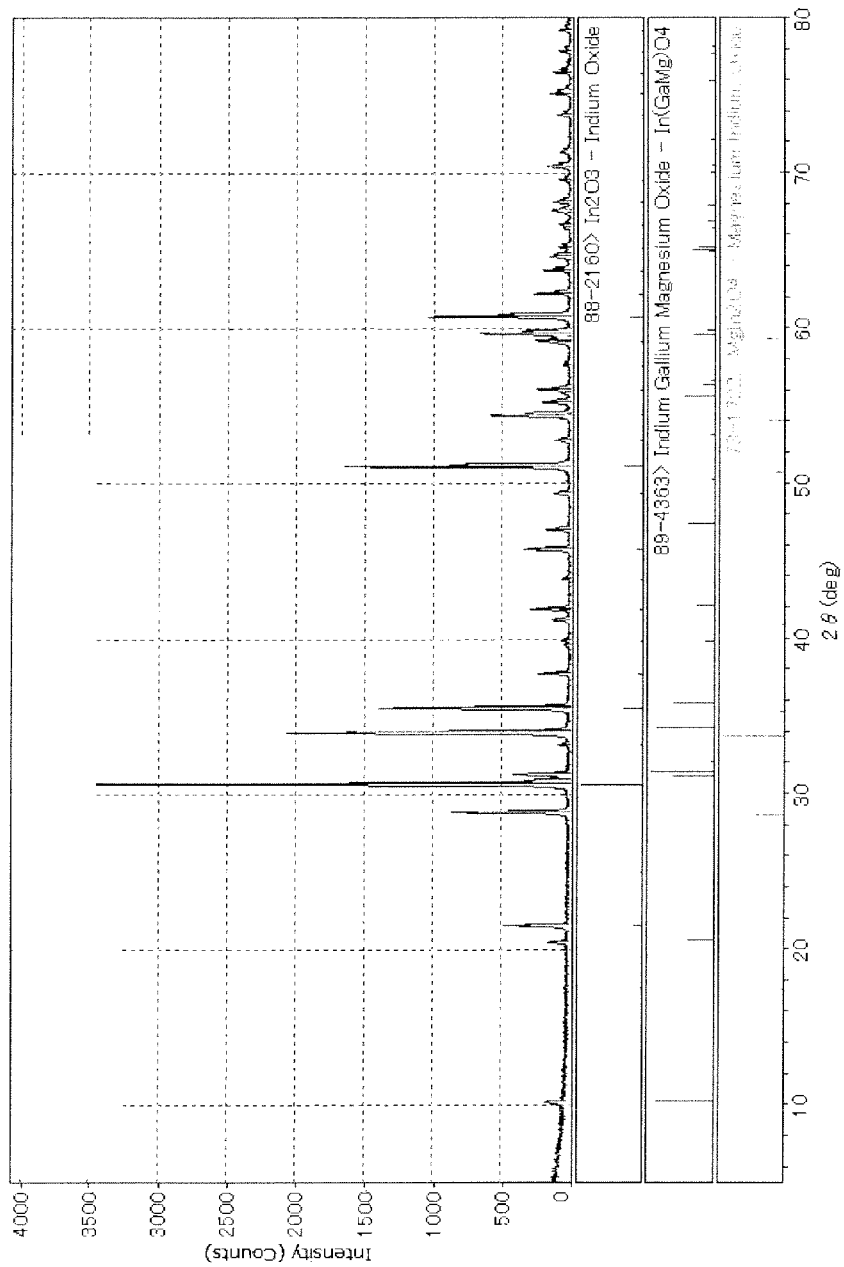
FIG. 3 is an X-ray diffraction chart of a sintered body obtained in Example 3.
Figure 4:
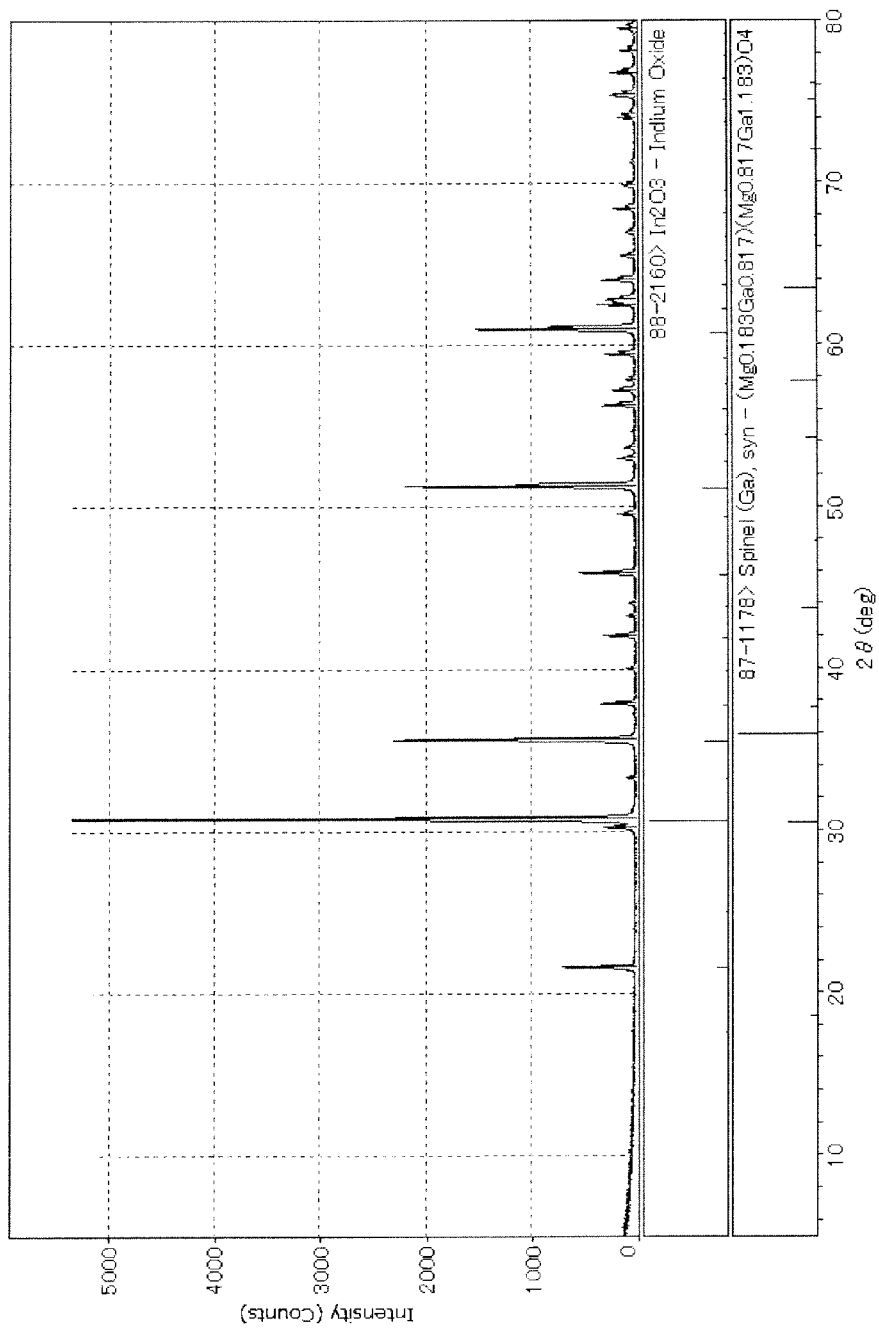
FIG. 4 is an X-ray diffraction chart of a sintered body obtained in Example 4.
Figure 5:
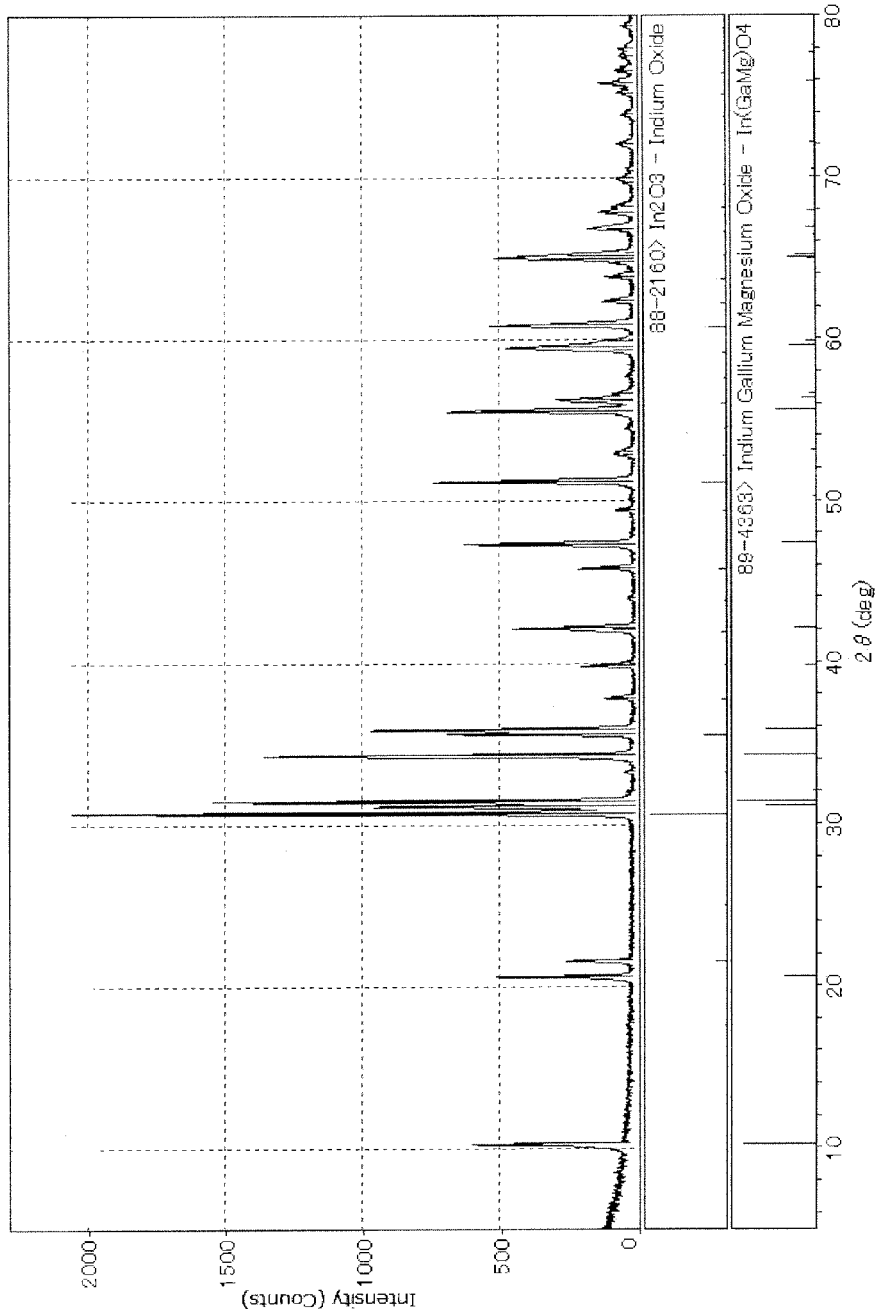
FIG. 5 is an X-ray diffraction chart of a sintered body obtained in Example 5.
Figure 6:
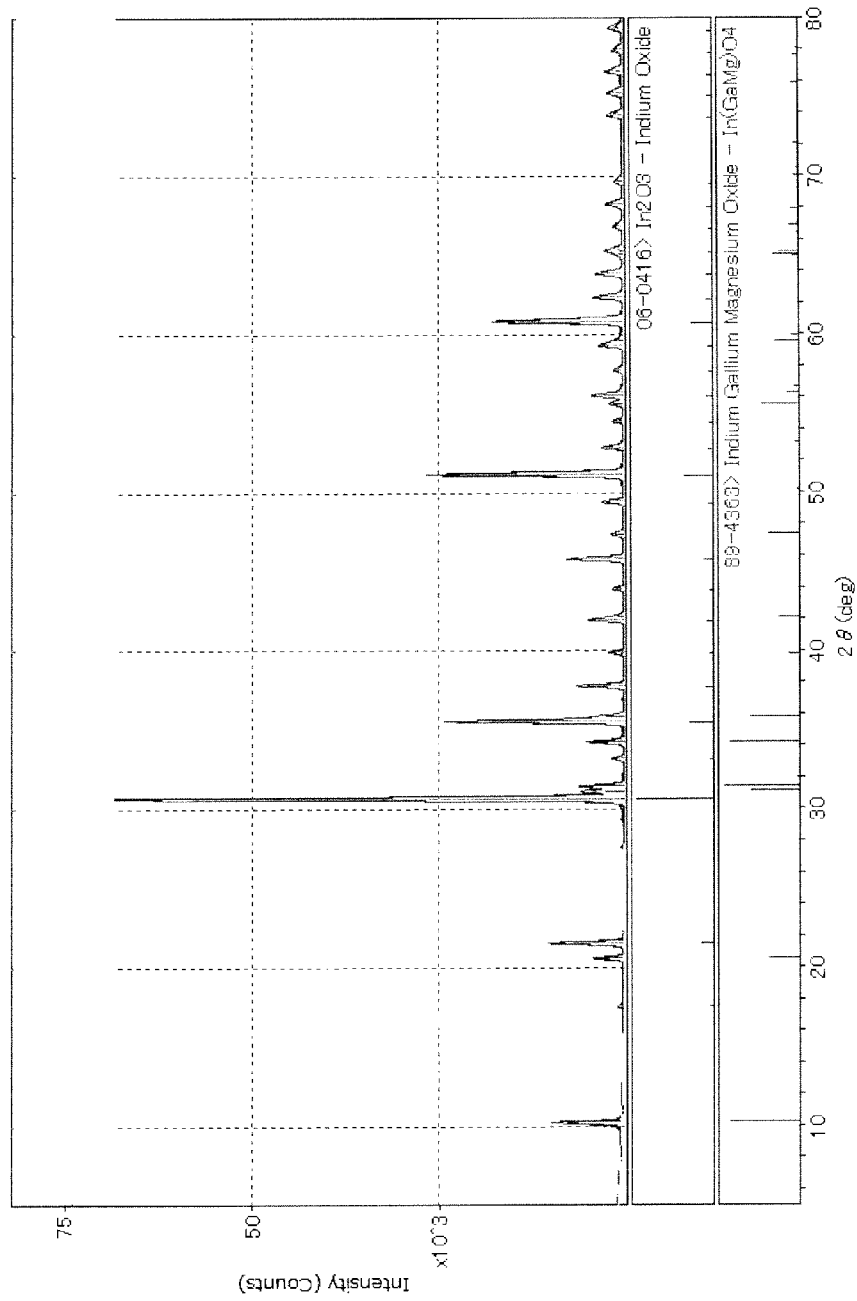
FIG. 6 is an X-ray diffraction chart of a sintered body obtained in Example 6.
Figure 7:
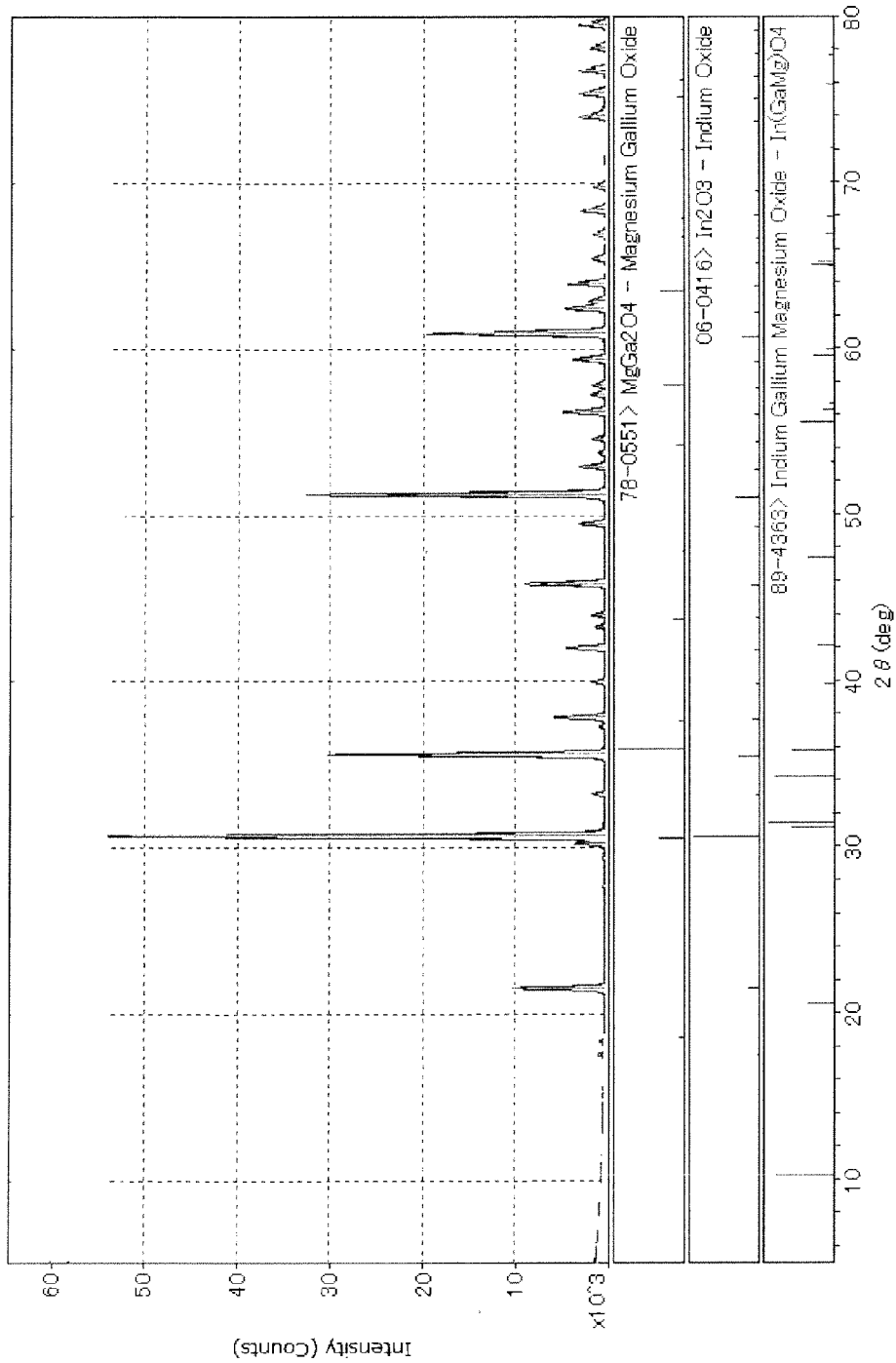
FIG. 7 is an X-ray diffraction chart of a sintered body obtained in Example 7.
Figure 8:
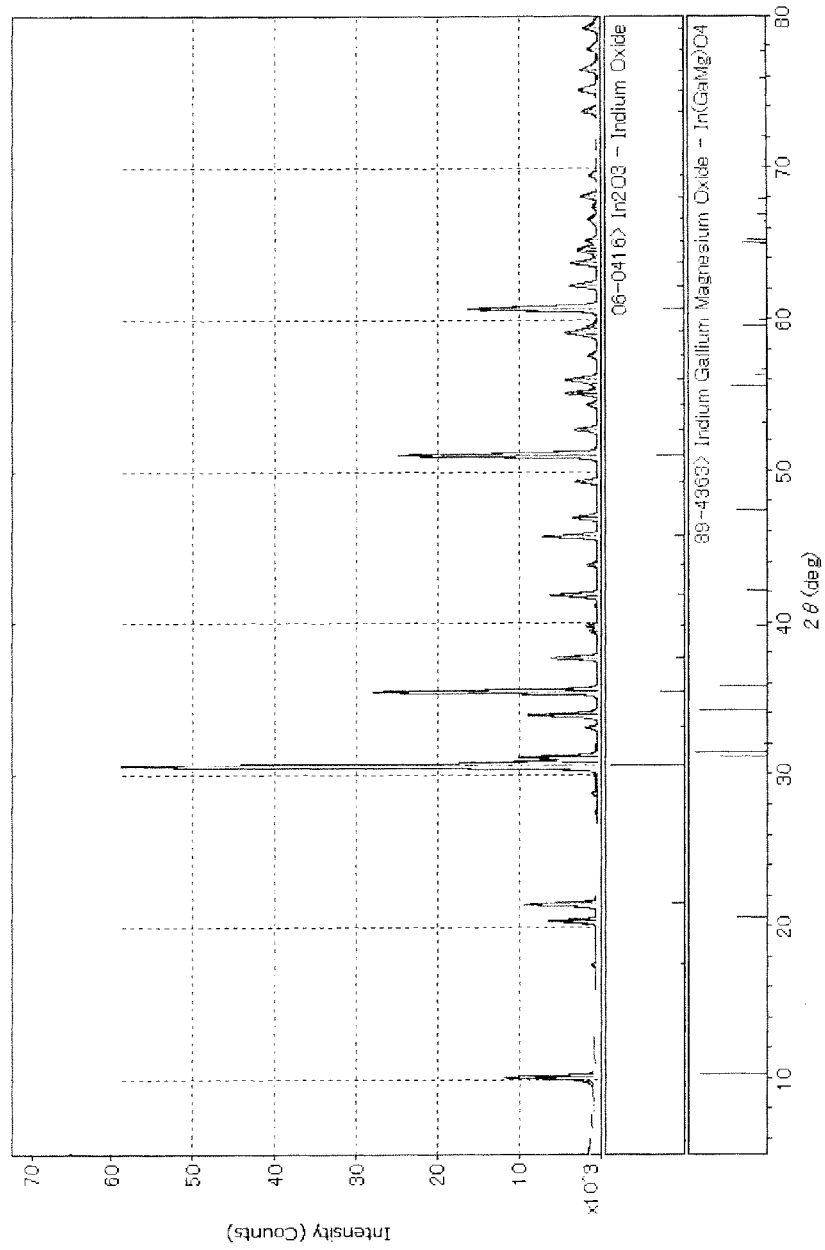
FIG. 8 is an X-ray diffraction chart of a sintered body obtained in Example 8.
Figure 9:
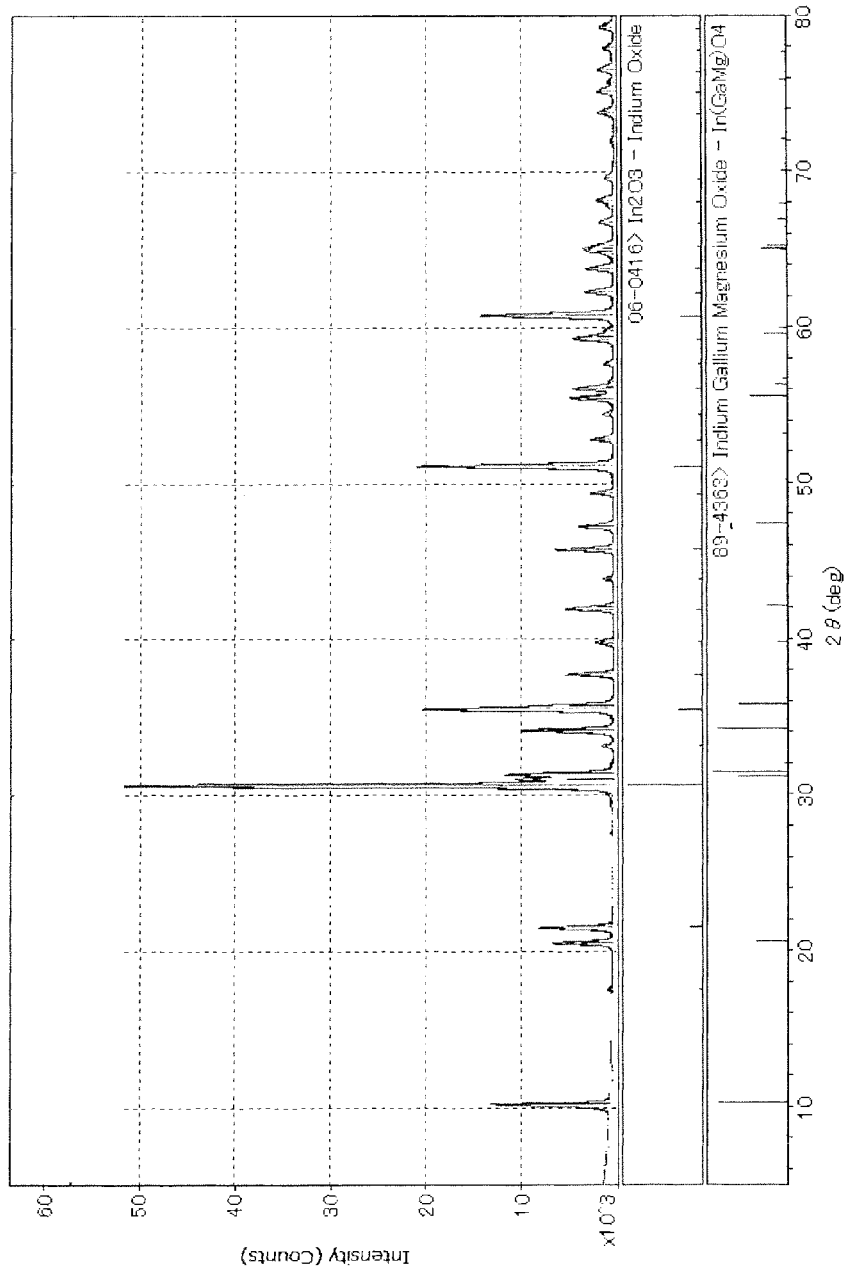
FIG. 9 is an X-ray diffraction chart of a sintered body obtained in Example 9.
Figure 10:
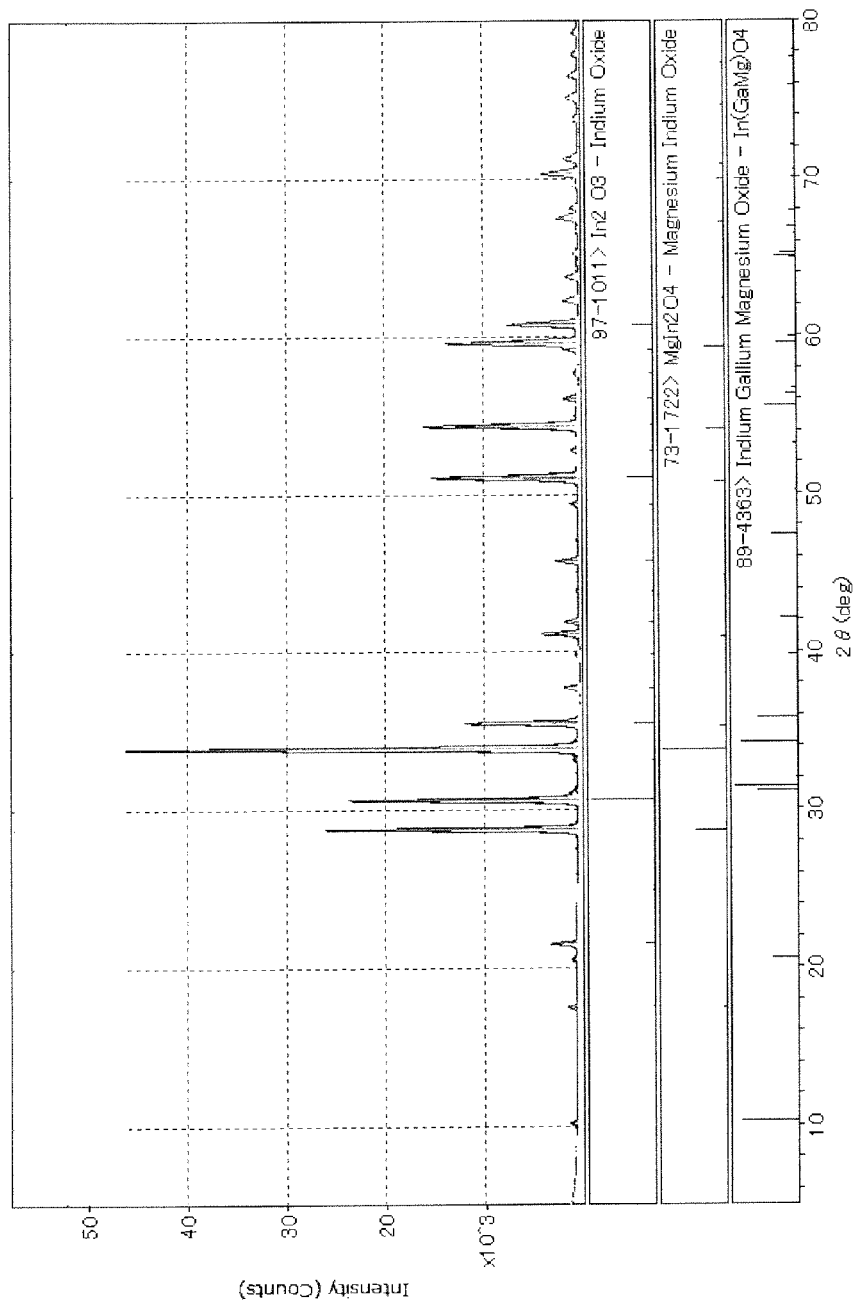
FIG. 10 is an X-ray diffraction chart of a sintered body obtained in Example 10.

The sputtering target of the invention comprises a sintered body comprising In, Ga and Mg, and the sintered body comprises one or more compounds selected from a compound represented by $In_2O_3$, a compound represented by $In(GaMg)O_4$, a compound represented by $Ga_2MgO_4$ and a compound represented by $In_2MgO_4$.

The sintered body satisfies the following atomic ratio.
In/(In+Ga+Mg)=0.5 or more and 0.9999 or less
(Ga+Mg)/(In+Ga+Mg)=0.0001 or more and 0.5 or less.

By co-doping $In_2O_3$ in the sintered body with Ga and Mg, which have strong bonding power with oxygen, the carrier concentration of the thin film can be sufficiently lowered.

In a thin film obtained from a sintered body in which $In_2O_3$ is doped with Zn and Mg, the carrier concentration cannot be lowered sufficiently, and the thin film may become a conductor.

When the sintered body comprises one or more compounds selected from a compound represented by $In_2O_3$, a compound represented by $In(GaMg)O_4$, a compound represented by $Ga_2MgO_4$ and a compound represented by $In_2MgO_4$, and comprises the above-mentioned atoms, the sputtering target of the invention enables stable sputtering to be conducted.

The sintered body may comprise all of the above-mentioned four compounds or may comprise one, two or three of the four compounds. The sintered body preferably comprises $In_2O_3$. It is more preferred that the sintered body comprise the following compounds or a combination of these compounds.

$In_2O_3$
$In_2O_3$ and $In(GaMg)O_4$
$In_2O_3$ and $In_2MgO_4$
$In_2O_3$ and $Ga_2MgO_4$
$In_2O_3$, $In(GaMg)O_4$ and $In_2MgO_4$
$In_2O_3$, $In(GaMg)O_4$ and $Ga_2MgO_4$ It is preferred that the above-mentioned sintered body do not comprise $Ga_2O_3$ and MgO. If $Ga_2O_3$ or MgO presents (remains) in the sintered body, it leads to occurrence of abnormal discharge or generation of nodules during sputtering, and deficiency may be generated in an oxide thin film formed by sputtering using the sintered body as a sputtering target.

If the atomic ratio of the sintered body used in the invention is outside the above-mentioned range, an oxide thin film formed by sputtering the sputtering target of the invention may become a conductor or an insulating film, not a semiconductor.

Specifically, if In/(In+Ga+Mg) is less than 0.5, the oxide thin film may be an insulator, not a semiconductor. If In/(In+Ga+Mg) exceeds 0.9999, the oxide thin film may become a conductive film.

If (Ga+Mg)/(In+Ga+Mg) is less than 0.0001, the oxide thin film may become a conductive film. If (Ga+Mg)/(In+Ga+Mg) exceeds 0.5, the oxide thin film may become an insulating film. If (Ga+Mg)/(In+Ga+Mg) exceeds 0.5, highly-resistant oxide such as $Ga_2O_3$ and MgO is deposited in a target, whereby nodules may be formed.

It is preferred that the above-mentioned atomic ratio In/(In+Ga+Mg) exceed 0.7 and 0.9999 or less, and (Ga+Mg)/(In+Ga+Mg) be 0.0001 or more and less than 0.3, and further preferably In/(In+Ga+Mg) exceed 0.8 and 0.9999 or less and (Ga+Mg)/(In+Ga+Mg) be 0.0001 or more and less than 0.2.

The ratio of Ga and Mg is preferably Mg/(Ga+Mg)=0.001 to 0.900, more preferably Mg/(Ga+Mg)=0.001 to 0.600.

The sintered body used in the invention preferably has a relative density of 90% or more.

If the relative density is 90% or more, a stable sputtering state can be maintained. If the relative density is less than 90%, the target surface may be blackened or abnormal discharge may occur. The relative density is preferably 95% or more, more preferably 97% or more.

The relative density can be measured by the Archimedian method. The relative density is preferably 100% or less. If the relative density exceeds 100%, metal particles may be generated in the sintered body or a lower oxide may be formed. Therefore, the oxygen supply amount during film formation is required to be controlled strictly.

Further, after sintering, the density can be adjusted by conducting a post-treatment or the like such as a heat-treatment in a reductive atmosphere. As the reductive atmosphere, argon, nitrogen, hydrogen or the like or a mixture of these gases can be used.

Further, it is preferred that a positive tetravalent metal oxide M be contained in the sintered body used in the invention. Due to the incorporation of a positive tetravalent metal oxide, effects such as improvement of sintering density of a sintered body, lowering of the bulk resistance of a sintered body or the like are brought about.

In addition, a positive tetravalent metal oxide has strong resistance to acids, and it can impart acid resistance to an amorphous oxide thin film.

It is preferred that the positive tetravalent metal oxide M be one or two or more oxides selected from $SnO_2$, $TiO_2$, $SiO_2$, $ZrO_2$, $GeO_2$, $HfO_2$ and $CeO_2$.

[M]/[all metals] is preferably 0.0001 to 0.20. In the formula, [M] is the total of positive tetravalent metal atoms contained in the sintered body, and [all metals] is the total of all metal atoms contained in the sintered body.

If [M]/[all metals] is less than 0.0001, effects of addition may be poor. A [M]/[all metals] exceeding 0.20 is not preferable, since the mobility of an oxide semiconductor film obtained by film formation may be lowered.

[M]/[all metals] is preferably 0.0005 to 0.15, more preferably 0.001 to 0.1.

The atomic ratio of each element contained in the sintered body of the invention can be obtained by quantitatively analyzing the elements contained by the Inductively Coupled Plasma Atomic Emission Spectroscopy (ICP-AES).

Specifically, a sample solution is atomized by means of a nebulizer, and then introduced into argon plasma (about 6000 to 8000° C.). The elements in the sample are excited by absorbing thermal energy, whereby orbit electrons are transferred from the ground state to an orbit with a higher energy level. These orbit electrons are transferred to an orbit with a lower energy level within about $10^{-7}$ to $10^{-8}$ seconds. At this time, difference in energy is radiated as light to cause emission. Since this light has a wavelength (spectral line) peculiar to the element, the presence of the element can be confirmed by the presence of the spectral line (qualitative analysis).

Further, since the amplitude of each spectral line (emission intensity) is in proportion to the number of elements in the sample, the concentration of the sample can be obtained by comparing a reference solution with a known concentration (quantitative analysis).

After specifying the contained element by the qualitative analysis, the content of the specified element is obtained by quantitative analysis. From the results, the atomic ratio of each element is obtained.

Within a range which does not impair the effects of the invention, the sintered body to be used in the invention may contain other elements than In, Ga, Mg and an arbitral tetravalent metal mentioned above, or may substantially comprise In, Ga, Mg and an arbitral tetravalent metal.

In the invention, the "substantially" means that the effects as the oxide sintered body are derived from In, Ga, Mg and an arbitral tetravalent metal mentioned above or that 98 wt % or more and 100 wt % or less (preferably 99 wt % or more and 100 wt % or less) of the metal element of the sintered body is In, Ga, Mg and an arbitral tetravalent metal.

As mentioned above, the oxide sintered body of the invention substantially comprises In, Ga, Mg and an arbitral tetravalent metal, and in an amount range which does not impair the advantageous effects of the invention, other impurities which have been inevitably mixed in may be contained.

It is preferred that the density of the sintered body of the invention be higher. It is preferably 6.0 g/cm$^3$ or more, more preferably 6.2 g/cm$^3$ or more, with 6.4 g/cm$^3$ or more being further preferable. Normally, the density is 7.1 g/cm$^3$ or less.

If the density is less than 6.0 g/cm$^3$, the surface of the sputtering target formed of the sintered body may be blackened, or the like, to induce abnormal discharge, leading to lowering of the sputtering speed.

It is desired that the maximum particle size of the crystal in the sintered body used in the invention be 5 μm or less. If the indium oxide crystal is grown to have a particle size exceeding 5 μm, nodules may be generated.

When the target surface is ground by sputtering, the grinding speed differs depending on the direction of the crystal surface, whereby unevenness is generated on the target surface. The size of this unevenness varies depending on the particle size of the crystal present in the sintered body. It is assumed that, and in the target formed of a sintered body having a large crystal particle size, a greater scale of unevenness occurs, and nodules are generated from this convex part.

The maximum particle size of the crystal of the sputtering target is obtained as follows. If the sputtering target of the invention has a circular shape, at five locations in total, i.e. the central point (one) and the points (four) which are on the two central lines crossing orthogonally at this central point and are middle between the central point and the peripheral part, or if the sputtering target has a square shape, at five locations in total, i.e. the central point (one) and middle points (four) between the central point and the corner of the diagonal line of the square, the maximum diameter is measured for the biggest particle observed within a 100-μm square. The maximum particle size is the average value of the particle size of the biggest particle present in each of the frames defined by the five locations. As for the particle size, the longer diameter of the crystal particle is measured. The crystal particles can be observed by the scanning electron microscopy (SEM).

The method for producing a sputtering target of the invention comprises the following two steps:

(1) A step in which raw material compounds are mixed and formed to form a formed body
(2) A step in which the above-mentioned formed body is sintered Hereinbelow, each step will be explained.

(1) a Step in which Raw Material Compounds are Mixed and Formed to Obtain a Formed Body No specific restrictions are imposed on the raw material compound. It suffices that the raw material compound be a compound comprising In, Ga and Mg, and the sintered body can have the following atomic ratio:
In/(In+Ga+Mg)=0.5 or more and 0.9999 or less, and
(Ga+Mg)/(In+Ga+Mg) is 0.0001 or more and 0.5 or less.

For example, a combination of indium oxide, gallium metal and magnesium metal, a combination of indium oxide, gallium oxide and magnesium oxide, or the like can be mentioned. It is preferred that the raw material be powder.

It is preferred that the raw material be a mixed powder of indium oxide, gallium oxide and magnesium oxide.

If a metal simple substance is used as a raw material, when a combination of indium oxide, gallium metal and magnesium metal is used as raw material powders, for example, metal particles of gallium or magnesium may be present in the resulting sintered body. As a result, metal particles on the target surface are molten during film formation and hence cannot be emitted from the target, resulting in a great difference between the composition of the film and the composition of the sintered body.

The average particle diameter of the raw material powder is preferably 0.1 μm to 1.2 μm, more preferably 0.1 μm to 1.0 μm or less. The average particle diameter of the raw material powder can be measured by a laser diffraction particle size distribution measuring apparatus or the like.

For example, $In_2O_3$ powder having an average particle diameter of 0.1 μm to 1.2 μm, $Ga_2O_3$ powder having an average particle diameter of 0.1 μm to 1.2 μm and MgO powder having an average particle diameter of 0.1 μm to 1.2

μm as the raw material powder are used, and these powders are compounded such that the atomic ratio In/(In+Ga+Mg) becomes 0.5 or more and 0.9999 or less and (Ga+Mg)/(In+Ga+Mg) becomes 0.0001 or more and 0.5 or less, preferably In/(In+Ga+Mg) becomes exceeding 0.7 and 0.9999 or less and (Ga+Mg)/(In+Ga+Mg) becomes 0.0001 or more and less than 0.3.

The method for mixing and forming in the step (1) is not particularly restricted, and a known method can be used. For example, an aqueous solvent is compounded with raw material powders including indium oxide powder, gallium oxide powder and magnesium oxide powder, and the resulting slurry is mixed for 12 hours or more. Then, the mixture is subjected to solid-liquid separation, dried and granulated, and the granulated product is then put in a mold and formed.

As for the method for mixing the raw material powder, a wet or dry ball mill, a vibration mill, a beads mill or the like can be used. In order to obtain uniform and fine crystal particles and voids, the most preferable method is a beads mill mixing method since it can pulverize the aggregate efficiently for a short period of time and can realize a favorable dispersed state of additives.

When a ball mill is used for mixing, the mixing time is preferably 15 hours or more, more preferably 19 hours or more. If the mixing time is insufficient, a high-resistant compound such as $Ga_2O_3$ and MgO may be generated in the resulting oxide sintered body.

When a beads mill is used for pulverizing and mixing, the pulverizing and mixing time is varied depending on the size of the apparatus used and the amount of slurry to be treated. However, the pulverizing and mixing time is controlled appropriately such that the particle distribution in the slurry becomes uniform, i.e. all of the particles have a particle size of 1 μm or less.

At the time of mixing, an arbitral amount of a binder is added, and mixing may be conducted together with the addition of the binder. As the binder, polyvinyl alcohol, vinyl acetate or the like can be used.

Granulated powder is obtained from the raw material powder slurry. For granulation, it is preferable to use quick dry granulation. As the apparatus for quick dry granulation, a spray dryer is widely used. Specific drying conditions are determined according to conditions such as the concentration of slurry to be dried, the temperature of hot air used for drying and the amount of wind. For actually conducting the quick dry granulation, it is required to obtain optimum conditions in advance.

In natural drying, since the speed of sedimentation differs due to the difference in specific gravity of the raw material powder, separation of $In_2O_3$ powder, $Ga_2O_3$ powder and MgO powder occurs, and as a result, uniform granulated powder may not be obtained. If a sintered body is made by using this un-uniform granulated powder, $Ga_2O_3$, MgO or the like may be generated inside the sintered body, causing abnormal discharge during sputtering.

The granulated powder can normally be formed at a pressure of 1.2 ton/cm$^2$ or more by means of a mold press or cold isostatic pressing (CIP).

(2) A step in which a formed body is sintered

The resulting formed body is sintered at 1200 to 1650° C. for 10 to 50 hours to obtain a sintered body.

The sintering temperature is preferably 1350 to 1600° C., more preferably 1400 to 1600° C., and further preferably 1450 to 1600° C. The sintering time is preferably 12 to 40 hours, more preferably 13 to 30 hours.

If the sintering temperature is less than 1200° C. or the sintering time is shorter than 10 hours, $Ga_2O_3$, MgO or the like may be formed within the target, causing abnormal discharge. On the other hand, if the firing temperature exceeds 1650° C. or the firing time exceeds 50 hours, an increase in average crystal diameter may occur due to significant crystal particle growth or due to generation of large voids, thereby causing a lowering in the strength of a sintered body or occurrence of abnormal discharge.

Further, by allowing the sintering temperature to be 1650° C. or less, sublimation of Ga can be suppressed.

For sintering the formed body, in addition to the atmospheric sintering pressing, a pressure sintering method such as hot pressing, oxygen pressurization and hot isostatic pressing or the like can be used. In respect of a decrease in production cost, possibility of mass production and easiness in production of a large-sized sintered body, it is preferable to use atmospheric sintering pressing.

In the atmospheric sintering pressing, a formed body is sintered in the air or the oxidizing gas atmosphere. Preferably, a formed body is sintered in the oxidizing gas atmosphere. The oxidizing gas atmosphere is preferably an oxygen gas atmosphere. It suffices that the oxygen gas atmosphere be an atmosphere having an oxygen concentration of 10 to 100 vol %, for example. When the sintered body of the invention is fabricated, the density of the sintered body can be further increased by introducing an oxygen gas atmosphere during the heating step.

As for the heating rate at the time of sintering, it is preferred that the heating rate be 0.1 to 2° C./min in a temperature range of from 800° C. to a sintering temperature (1200 to 1650° C.).

A temperature range of from 800° C. and higher is a range where sintering proceeds most quickly. If the heating rate in this temperature range is less than 0.1° C./min, growth of crystal particles becomes significant, whereby an increase in density may not be attained. On the other hand, if the heating rate is higher than 2° C./min, $Ga_2O_3$, MgO or the like may be deposited within the target.

The heating rate from 800° C. to a sintering temperature is preferably 0.1 to 1.2° C./min, more preferably 0.1 to 0.8° C./min.

In order to allow the bulk resistance of the sintered body obtained in the above-mentioned firing step to be uniform in the entire target, a reduction step may be further provided, if necessary.

As the reduction method, a reduction treatment by firing in a reductive gas, a reduction treatment by vacuum firing, a reduction treatment by firing in an inert gas or the like can be given, for example.

In the case of a reduction treatment by firing in a reductive gas, hydrogen, methane, carbon monoxide, or a mixed gas of these gases with oxygen or the like can be used.

In the case of a reduction treatment by firing in an inert gas, nitrogen, argon, or a mixed gas of these gases with oxygen or the like can be used.

The temperature at the time of the above-mentioned reduction treatment is normally 100 to 800° C., preferably 200 to 800° C. The reduction treatment is conducted normally for 0.01 to 10 hours, preferably 0.05 to 5 hours.

In summary, in the method for producing a sintered body used in the invention, a water-based solvent is compounded with raw material powders containing mixed powder of indium oxide powder, gallium oxide powder and magnesium oxide powder, and the resulting slurry is mixed for 12 hours or longer. Thereafter, the slurry is subjected to solid-liquid separation, dried and granulated. Subsequently, the granulated product is put in a mold and formed. Then, the resulting formed product is fired at 1200 to 1650° C. for 10 to 50 hours with a heating rate in a temperature range of from 800° C. to the sintering temperature being 0.1 to 2° C./min, whereby a sintered body can be obtained.

By controlling the various conditions in the production steps of a sintered body as mentioned above, it is possible to obtain a sintered body having an atomic ratio of In/(In+Ga+Mg)=0.5 or more and 0.9999 or less and (Ga+Mg)/(In+Ga+Mg)=0.0001 or more and 0.5 or less, having a sintered body density of 6.0 g/cm$^3$ or more and comprising a compound represented by $In_2O_3$, a compound represented by $In(GaMg)O_4$, a compound represented by $Ga_2MgO_4$ and/or a compound represented by $In_2MgO_4$.

By processing the sintered body obtained above, the sputtering target of the invention can be obtained. Specifically, by grinding the sintered body into a shape suited to be mounted in a sputtering apparatus, a sputtering target material is obtained. Then, the sputtering target material is bonded to a backing plate, whereby a sputtering target can be obtained.

Specifically, in order to allow the sintered body to be a target material, the sintered body is ground by means of a surface grinder to allow the surface roughness Ra to be 5 μm or less. Further, the sputtering surface of the target material may be subjected to mirror finishing, thereby allowing the average surface roughness thereof Ra to be 1000 Å or less.

For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

It is preferable to finish the surface of the target material by means of a #200 to #10,000 diamond wheel, particularly preferably by means of a #400 to #5,000 diamond wheel. If a diamond wheel with a mesh size of smaller than #200 or a diamond wheel with a mesh size of larger than #10,000 is used, the target material may be broken easily.

It is preferred that the surface roughness Ra of the target material be 0.5 μm or less and that the grinding surface have no directivity. If Ra is larger than 0.5 μm or the grinding surface has directivity, abnormal discharge may occur or particles may be generated.

The thus processed target material may be subjected to a cleaning treatment. For cleaning, air blowing, washing with running water or the like can be used. When foreign matters are removed by air blowing, foreign matters can be removed more effectively by air intake by means of a dust collector from the side opposite from the nozzle.

Since the above-mentioned air blow or washing with running water has its limit, ultrasonic cleaning or the like can also be conducted. In ultrasonic cleaning, it is effective to conduct multiplex oscillation within a frequency range of 25 to 300 KHz. For example, it is preferable to perform ultrasonic cleaning by subjecting 12 kinds of frequency composed of every 25 KHz in a frequency range of 25 to 300 KHz to multiplex oscillation.

The thickness of the target material is normally 2 to 20 mm, preferably 3 to 12 mm, and particularly preferably 4 to 6 mm.

By bonding the target material obtained in the manner as mentioned above to a backing plate, a sputtering target can be obtained. A plurality of target materials may be provided in a single backing plate to be used as a substantially single target.

II. Oxide Thin Film

The method for producing an oxide thin film of the invention is characterized in that it is formed by a sputtering method by using the above-mentioned sputtering target.

The oxide thin film produced by the method for producing an oxide thin film of the invention comprises indium, gallium, magnesium and oxygen, and normally has an atomic ratio of In/(In+Ga+Mg) of 0.5 or more and 0.9999 or less and (Ga+Mg)/(In+Ga+Mg) of 0.0001 or more and 0.5 or less.

Gallium oxide has an effect of decreasing the lattice constant of indium oxide. As a result, the 5 s orbits of indiums in the crystal is overlapped to a higher degree, whereby improvement of mobility can be expected, Magnesium oxide is expected to have effects of lowering the carrier concentration of the oxide thin film.

If the atomic ratio (Ga+Mg)/(In+Ga+Mg) of the oxide thin film is less than 0.0001, fine crystals may be formed immediately after deposition, and secondary crystallization occurs during heating as a post treatment. In the thin film which has been subjected to secondary crystallization, not only mobility is lowered but a film suffers oxygen deficiency, whereby an increase in carrier concentration may occur.

An oxide thin film formed by using the sputtering target having an atomic ratio of (Ga+Mg)/(In+Ga+Mg) exceeding 0.5, $Ga_2O_3$ or MgO may be deposited in the thin film, causing electrons to be scattered to lower the mobility.

The sputtering target of the invention has high conductivity. Therefore, a DC sputtering method in which the deposition speed is high can be applied.

In addition to the above-mentioned DC sputtering method, the RF sputtering method, the AC sputtering method and the pulse DC sputtering method can be applied to the sputtering target of the invention, and sputtering which is free from the fear of abnormal discharge is possible.

The oxide semiconductor thin film can be formed by using the above-mentioned sintered body by the deposition method, the sputtering method, the ion plating method, the pulse laser deposition method or the like.

As the sputtering gas, a mixed gas of a rare gas atom such as argon and an oxidizing gas can be used. Examples of the oxidizing gas include $O_2$, $CO_2$, $O_3$, $H_2O$ and $N_2O$. As the sputtering gas, a mixed gas containing a rare gas atom and one or more molecules selected from a water molecule, an oxygen molecule and a nitrous oxide molecule is preferable. A mixed gas containing a rare gas atom and at least a water molecule is more preferable.

The oxygen partial pressure at the time of film formation by sputtering is preferably 0% or more and less than 40%. A thin film formed under the conditions in which the oxygen partial pressure is 40% or more has a significantly decreased carrier concentration. The carrier concentration may be less than $10^{13}$ cm$^{-3}$.

The oxygen partial pressure is preferably 0 to 30% or more and particularly preferably 2 to 15%.

The partial pressure of water contained in a sputtering gas (atmosphere) at the time of depositing an oxide thin film in the invention, i.e. $[H_2O]/([H_2O]+[\text{rare gas}]+[\text{other molecules}])$, is preferably 0 to 25%.

On the other hand, if the water partial pressure exceeds 25%, the film density may be lowered significantly, and as a result, the degree of overlapping of the In 5 s orbit may become small, causing a lowering in mobility. The water partial pressure in the atmosphere at the time of sputtering is more preferably 0.1 to 25%, further preferably 0.7 to 13%, with 1 to 6% being particularly preferable.

The substrate temperature at the time of film formation by sputtering is preferably 25 to 120° C., further preferably 25 to 100° C., and particularly preferably 25 to 90° C. If the substrate temperature at the time of film formation is higher than 120° C., fine crystals may be formed in the film immediately after thin film deposition, and the carrier concentration of the thin film after crystallization by heating may exceed $10^{18}/cm^3$. Further, if the substrate temperature at the time of film formation is lower than 25° C., the density of the thin film may be lowered, resulting in lowering in mobility of a TFT.

It is preferred that the oxide thin film obtained by sputtering be further subjected to an annealing treatment by holding at 150 to 500° C. for 15 minutes to 5 hours. The annealing treatment temperature after film formation is more preferably 200° C. or more and 450° C. or less, further preferably 250° C. or more and 350° C. or less. By conducting the above-mentioned annealing treatment, semiconductor properties can be obtained.

The carrier concentration of the oxide semiconductor thin film is normally $10^{18}/cm^3$ or less, preferably $10^{13}$ to $10^{18}/cm^3$ or less, further preferably $10^{14}$ to $10^{17}/cm^3$, and particularly preferably $10^{15}$ to $10^{17}/cm^3$.

If the carrier concentration of the oxide layer is larger than $10^{18}$ cm$^{-3}$, current leakage occurs when a device such as a thin film transistor is fabricated. Further, since the transistor becomes normally-on or has a small on-off ratio, good transistor performance may not be exhibited. Further, if the carrier concentration is less than $10^{13}$ cm$^{-3}$, due to the small number of carriers, the device may not be driven as a TFT.

The carrier concentration of the oxide semiconductor thin film can be measured by the hall effect measurement.

By co-doping indium oxide with magnesium oxide and gallium oxide, the carrier concentration can be stably controlled at $10^{18}/cm^3$ or less.

The heating atmosphere is not particularly restricted. In respect of carrier control properties, the air atmosphere or the oxygen-circulating atmosphere is preferable.

In the annealing treatment as the post treatment of the oxide thin film, in the presence or absence of oxygen, a lamp annealing apparatus, a laser annealing apparatus, a thermal plasma apparatus, a hot air heating apparatus, a contact heating apparatus or the like can be used.

The distance between the target and the substrate at the time of sputtering is preferably 1 to 15 cm in a direction perpendicular to the film forming surface of the substrate, with 2 to 8 cm being further preferable. If this distance is less than 1 cm, the kinetic energy of particles of target-constituting elements which arrive the substrate becomes large, good film properties may not be obtained, and in-plane distribution of the film thickness and the electric characteristics may occur. If the interval between the target and the substrate exceeds 15 cm, the kinetic energy of particles of target-constituting elements becomes too small, and a dense film may not be obtained, and as a result, good semiconductor properties may not be attained.

As for the formation of an oxide thin film, it is desirable that film formation be conducted by sputtering in an atmosphere having a magnetic field intensity of 300 to 1500 gauss. If the magnetic field intensity is less than 300 gauss, since the plasma density is lowered, sputtering may not be conducted if the sputtering target has a high resistance. On the other hand, if the magnetic field intensity exceeds 1500 gauss, the film thickness and the electric characteristics of the film may not be well-controlled.

No specific restrictions are imposed on the pressure of a gas atmosphere (sputtering pressure), as long as plasma is stably discharged. The pressure is preferably 0.1 to 3.0 Pa, further preferably 0.1 to 1.5 Pa, with 0.1 to 1.0 Pa being particularly preferable. If the sputtering pressure exceeds 3.0 Pa, the mean free path of sputtering particles may become short, resulting in lowering of density of a thin film. If the sputtering pressure is less than 0.1 Pa, fine crystals may be formed in a film during film formation. Meanwhile, the sputtering pressure is the total pressure in the system at the start of sputtering after a rare gas atom (e.g. argon), a water molecule, an oxygen molecule or the like are introduced.

III. Thin Film Transistor and Display

The above-mentioned oxide thin film can be used in a thin film transistor, and can be particularly preferably used as a channel layer.

The device configuration of the thin film transistor is not particularly restricted as long as it has the above-mentioned oxide thin film as a channel layer, and known various device configurations can be used.

The thickness of the channel layer in the thin film transistor of the invention is normally 10 to 300 nm, preferably 20 to 250 nm, more preferably 30 to 200 nm, further preferably 35 to 120 nm, and particularly preferably 40 to 80 nm. If the thickness of the channel layer is less than 10 nm, due to un-uniformity of the film thickness when the layer is formed to have a large area, the properties of a TFT fabricated may become un-uniform within the plane.

If the film thickness exceeds 300 nm, the film formation time may become too long to be industrially applied.

The channel layer in the thin film transistor of the invention is normally used in the N-type region. However, in combination with various P-type semiconductors such as a P-type Si-based semiconductor, a P-type oxide semiconductor and a P-type organic semiconductor, the channel layer can be used in various semiconductor devices such as a PN junction transistor.

In the thin film transistor of the invention, it is preferred that a protective film be provided on the channel layer. It is preferred that the protective film in the thin film transistor of the invention comprise at least $SiN_x$. As compared with $SiO_2$, $SiN_x$ is capable of forming a dense film, and hence has an advantage that it has significant effects of preventing deterioration of a TFT.

The protective film may comprise, in addition to SiNx, an oxide such as $SiO_2$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $Sm_2O_3$, $SrTiO_3$ or AlN. It is preferred that the protective film substantially comprise only $SiN_x$. Here, the "substantially comprise only $SiN_x$" means that 70 wt % or more, preferably 80 wt % or more and further preferably 85 wt % or more of the thin film constituting the protective film in the thin film transistor of the invention is $SiN_x$.

Before forming a protective film, it is preferred that the channel layer be subjected to an ozone treatment, an oxygen plasma treatment or a nitrous oxide plasma treatment. Such a treatment may be conducted at any time as long as it is after the formation of a channel layer and before the formation of a protective film. However, it is desirable that the treatment be conducted immediately before the formation of a protective film. By conducting such a pre-treatment, generation of oxygen deficiency in the channel layer can be suppressed.

If hydrogen diffuses in the oxide semiconductor film during the driving of a TFT, the threshold voltage may be shifted, resulting in lowering of reliability of a TFT. By subjecting the channel layer to an ozone treatment, an oxygen plasma treatment or a nitrous oxide plasma treatment, the In—OH bonding in the crystal structure is stabilized, whereby diffusion of hydrogen in the oxide semiconductor film can be suppressed.

The thin film transistor is normally provided with a substrate, a gate electrode, a gate-insulating layer, an organic semiconductor layer (channel layer), a source electrode and a drain electrode. The channel layer is as mentioned above. A known material can be used for the substrate.

No particular restrictions are imposed on the material forming the gate insulating film in the thin film transistor of the invention. A material which is generally used can be arbitrary selected. Specifically, a compound such as $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, AlN or the like can be used, for example. Of these, $SiO_2$, $SiN_x$, $Al_2O_3$, $Y_2O_3$, $HfO_2$ and $CaHfO_3$, are preferable, with $SiO_2$, $SiN_x$, $Y_2O_3$, $HfO_2$ and $Al_2O_3$ being more preferable.

The gate insulating film can be formed by the plasma CVD (Chemical Vapor Deposition) method, for example.

If a gate insulating film is formed by the plasma CVD method and a channel layer is formed thereon, hydrogen in the gate insulating film diffuses in the channel layer, and as a result, deterioration of film quality of the channel layer or lowering of reliability of a TFT may be caused. In order to prevent deterioration of film quality of the channel layer or lowering of reliability of a TFT, it is preferred that the gate insulating film be subjected to an ozone treatment, an oxygen plasma treatment or a nitrous oxide plasma treatment before the formation of a channel layer. By conducting such a pre-treatment, deterioration of film quality of the channel layer or lowering of reliability of a TFT can be prevented.

The number of oxygen atoms of these oxides does not necessarily coincide with the stoichiometric ratio (e.g., $SiO_2$ or $SiO_x$ may be used).

The gate insulting film may have a structure in which two or more different insulating films are stacked. The gate insulating film may be crystalline, polycrystalline, or amorphous. The gate insulating film is preferably polycrystalline or amorphous from the viewpoint of easiness of industrial production.

No specific restrictions are imposed on the material forming each electrode in the thin film transistor, i.e. a drain electrode, a source electrode and a gate electrode, and materials which are generally used can be arbitrarily selected. For example, transparent electrodes such as ITO, IZO, ZnO, $SnO_2$ or the like, a metal electrode such as Al, Ag, Cu, Cr, Ni, Mo, Au, Ti, and Ta or an alloy metal electrode containing these metals can be used.

Each of the drain electrode, the source electrode and the gate electrode may have a multi-layer stack in which two or more different conductive layers are stacked. In particular, since the source/drain electrodes are required to be used in low-resistance wiring, the electrodes may be used by sandwiching a good conductor such as Al and Cu with metals having good adhesiveness such as Ti and Mo.

The thin film transistor of the invention can be applied to various integrated circuits such as a field effect transistor, a logical circuit, a memory circuit and a differential amplifier circuit. Further, in addition to a field effect transistor, it can be applied to a static induction transistor, a Schottky barrier transistor, a Schottky diode and a resistance element.

As for the configuration of the thin film transistor of the invention, a known configuration such as a bottom-gate configuration, a bottom-contact configuration and a top-contact configuration can be used without restrictions.

In particular, a bottom-gate configuration is advantageous since high performance can be obtained as compared with a thin film transistor comprising amorphous silicon and ZnO. The bottom-gate configuration is preferable since the number of masks at the time of production can be decreased easily and the production cost for application such as a large-sized display or the like can be reduced.

The thin film transistor of the invention can preferably be used as a display.

For use in a large-sized display, a channel-etch type bottom-gate thin film transistor is particularly preferable. A channel-etch type bottom-gate thin film transistor can produce a panel for a display at a low cost since the number of photo-masks used in photolithography is small. Of these, a channel-etch type thin film transistor having a bottom-gate configuration and a channel-etch type thin film transistor having a top-contact configuration are preferable since they can be industrialized easily due to excellent properties such as mobility.

EXAMPLES

Example 1 to 13

[Production of a Sintered Body]

The following oxide powders were used as the raw material powders.

The average particle size of the raw material oxide powders was measured by means of a laser diffraction particle size analyzer (SALD-300V, manufactured by Shimadzu Corporation), and as the average particle size, the median diameter D50 was used.

Indium oxide powder: Average particle diameter 0.98 μm
Gallium oxide powder: Average particle diameter 0.96 μm
Magnesium oxide powder: Average particle diameter 0.98 μm The above-mentioned powders were weighed such that the atomic ratio Ga/(In+Ga+Mg) and Mg/(In+Ga+Mg) shown in Table 1 were attained. After finely pulverizing and mixing uniformly, granulation was conducted after adding a binder. Subsequently, the raw material powders were uniformly placed in a mold, and subjected to pressure molding at a press atmosphere of 140 MPa by means of a cold pressing machine.

The thus obtained formed body was sintered in a sintering furnace at a heating rate shown in Table 1 (from 800° C. to the sintering temperature), at a sintering temperature and for a sintering time shown in Table 1, thereby to obtain a sintered body. The heating was conducted in an oxygen atmosphere, and other steps were conducted in an atmosphere, and the cooling rate was 15° C./min.

The relative density of the resulting sintered body was measured by the Archimedian method.

[Analysis of a Sintered Body]

An ICP-AES analysis was conducted for the resulting sintered body, and it was confirmed that the sintered body had an atomic ratio shown in Table 1.

For the resulting sintered body, the crystal structure was examined by an X-ray diffraction apparatus (XRD). The X-ray charts of the sintered bodies obtained in Examples 1 to 10 are shown in FIGS. 1 to 10.

As a result of an analysis of the charts, $In_2O_3$ and $In(GaMg)O_4$ were observed in the sintered body of Example 1, for example. The crystal structure can be confirmed by JCPDS (Joint Committee of Powder Diffraction Standards) card.

In the sintered bodies of Examples 1 to 13, $Ga_2O_3$ or MgO which caused nodules were not observed.

The measuring conditions of the X-ray diffraction measurement (XRD) are as follows.

Apparatus: Ultima-III, manufactured by Rigaku Corporation
X rays: Cu-Kα rays (wavelength: 1.5406 Å, monochromatized by means of a graphite monochrometer)

2θ-θ reflection method, continuous scanning (1.0°/min)
Sampling interval: 0.02°
Slit DS, SS: 2/3°, RS: 0.6 mm For the resulting sintered body, dispersion of Ga and Mg was examined by the electron probe microanalyzer (EPMA) measurement. As a result, an aggregate of Ga or Mg each having a size of 5 μm or more was not observed, and it was understood that the sintered bodies used in the invention were significantly excellent in dispersibility and uniformity.

The measuring conditions of EPMA are as follows.
Name of apparatus: JXA-8200 (manufactured by JEOL Ltd.)
Acceleration voltage: 15 kV
Irradiation current: 50 nA
Irradiation time (per point): 50 mS

[Production of a Sputtering Target]

The surfaces of the sintered bodies obtained in Examples 1 to 13 were ground by means of a surface grinder. The corners were cut by means of a diamond cutter and the oxide sintered bodies were laminated to a backing plate, whereby sputtering targets each having a diameter of 4 inches were obtained.

[Confirmation of Occurrence of Abnormal Discharge]

The resulting sputtering targets were mounted in a DC sputtering apparatus. Argon was used as the sputtering gas, and 10 kWh continuous sputtering was conducted under the following conditions:
Sputtering pressure: 0.4 Pa
Substrate temperature: room temperature
DC output: 400 W Variations in voltage during sputtering were stored in a data logger to confirm occurrence of abnormal discharge. The results are shown in Table 1.

Occurrence of the above-mentioned abnormal discharge was confirmed by detecting abnormal discharge by monitoring variations in voltage. Specifically, a case where variations in voltage which occurred during a 5-minute measurement accounted for 10% or more of the working voltage during the sputtering operation was evaluated as abnormal discharge. In particular, when the working voltage varies ±10% in 0.1 sec during the sputtering operation, a micro-arc which is abnormal discharge of sputtering discharge may have occurred. In such a case, the yield of a device may be lowered, leading to difficulty in mass production of a device.

[Confirmation of Generation of Nodules]

Further, by using the sputtering targets in Examples 1 to 13, and by using as the atmosphere a mixed gas in which 3% (in terms of partial pressure) hydrogen gas was added to an argon gas, sputtering was conducted continuously for 30 hours. Occurrence of nodules was confirmed. As a result, on the surface of the sputtering targets in Examples 1 to 13, no nodules were observed.

The sputtering conditions were as follows. Sputtering pressure: 0.4 Pa, DC output: 100 W, Substrate temperature: room temperature. The hydrogen gas was added to the atmospheric gas in order to promote the generation of nodules.

As for observation of the nodules, a change in the target surface after sputtering was observed by means of a stereoscopic microscope (magnification: ×50), and the average number of nodules with a size of 20 μm or more which were generated in a viewing field of 3 mm$^2$ was calculated. The number of generated nodules was shown in Table 1.

Comparative Examples 1 and 2

The sintered bodies and the sputtering targets were produced and evaluated in the same manner as in Examples 1 to 13, except that the raw material powders were mixed at atomic ratios Ga/(In+Ga+Mg) and Mg/(In+Ga+Mg) shown in Table 1 and sintering was conducted at a heating rate (from 800° C. to sintering temperature), at sintering temperatures and for sintering times shown in Table 1. The results are shown in Table 1.

Figure 11:
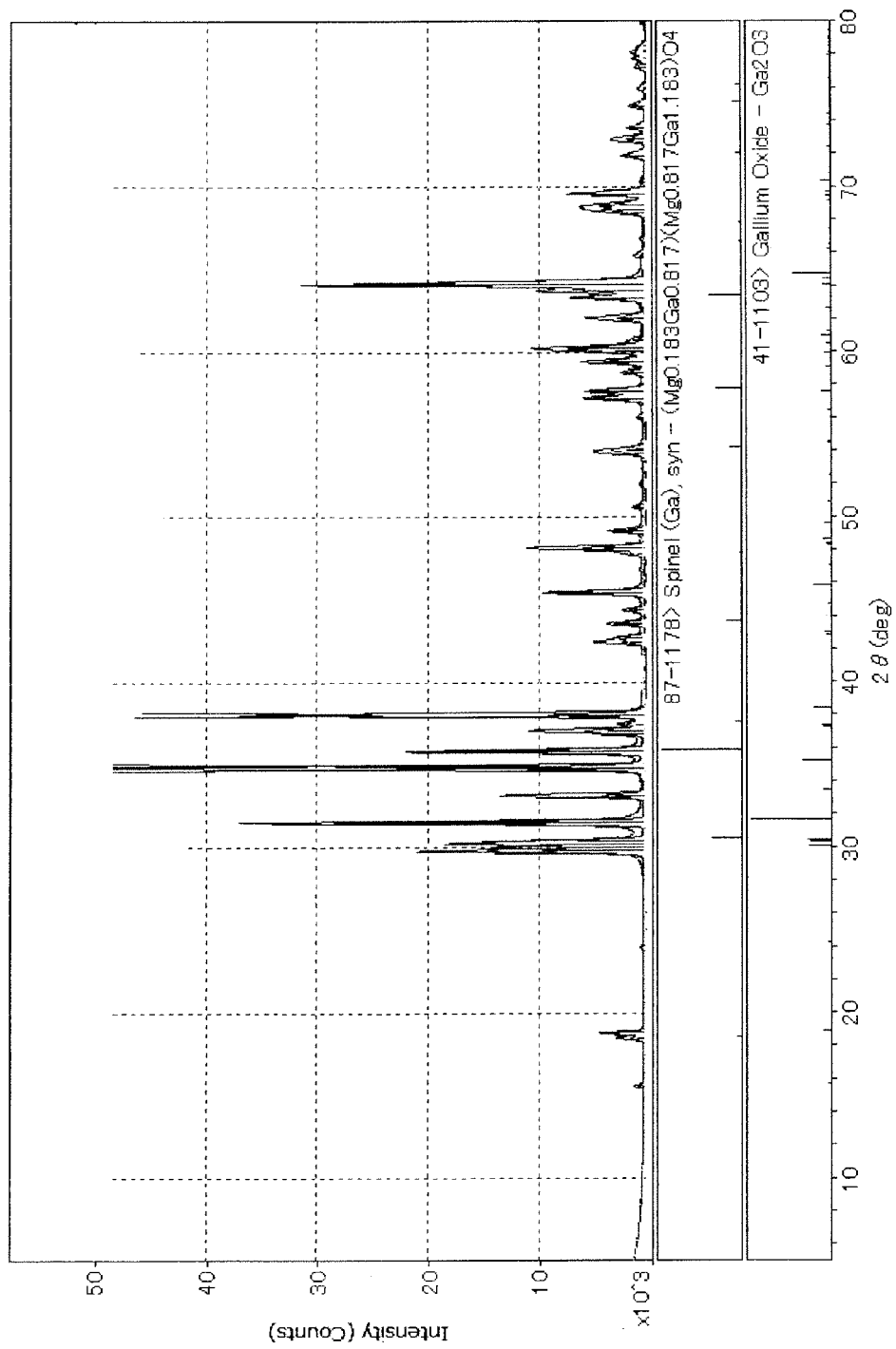
FIG. 11 is an X-ray diffraction chart of a sintered body obtained in Comparative Example 1.

In the sintered bodies obtained in Comparative Examples 1 and 2, a $Ga_2O_3$ phase was observed in an X-ray diffraction chart. Since the $Ga_2O_3$ phase is a high-resistant phase, it is thought that it causes nodules to be generated. An X-ray diffraction chart of Comparative Example 1 is shown in FIG. 11.

In the sputtering targets of Comparative Examples 1 and 2, abnormal discharge occurred during sputtering, and nodules were observed on the surface of the target.

TABLE 1

| | Ga/(In + Ga + Mg) | Mg/(In + Ga + Mg) | Heating rate [° C./min] (From 800° C. to sintering temperature) | Sintering temperature [° C.] | Sintering time [hr] | Formed compound | Target relative density [%] | Occurrence of abnormal discharge during sputtering | Number of nodules generated [per 3 mm$^2$] |
|---|---|---|---|---|---|---|---|---|---|
| Example 1 | 0.05 | 0.05 | 0.10 | 1400 | 12 | $In_2O_3$, $In(GaMg)O_4$ | 97 | Not occurred | 0 |
| Example 2 | 0.1 | 0.1 | 0.15 | 1350 | 15 | $In_2O_3$, $In(GaMg)O_4$, $MgIn_2O_4$ | 96 | Not occurred | 0 |
| Example 3 | 0.1 | 0.2 | 0.30 | 1500 | 20 | $In_2O_3$, $In(GaMg)O_4$, $MgIn_2O_4$ | 95 | Not occurred | 0 |
| Example 4 | 0.2 | 0.1 | 0.20 | 1500 | 15 | $In_2O_3$, $Ga_2MgO_4$ | 95 | Not occurred | 0 |
| Example 5 | 0.25 | 0.25 | 0.12 | 1450 | 20 | $In_2O_3$, $In(GaMg)O_4$ | 92 | Not occurred | 0 |
| Example 6 | 0.049 | 0.058 | 0.12 | 1450 | 20 | $In_2O_3$, $In(GaMg)O_4$ | 94 | Not occurred | 0 |
| Example 7 | 0.097 | 0.058 | 0.12 | 1450 | 20 | $In_2O_3$, $MgGa_2O_4$, $In(GaMg)O_4$ | 94 | Not occurred | 0 |
| Example 8 | 0.045 | 0.182 | 0.12 | 1450 | 20 | $In_2O_3$, $In(GaMg)O_4$ | 94 | Not occurred | 0 |
| Example 9 | 0.045 | 0.1 | 0.12 | 1450 | 20 | $In_2O_3$, $In(GaMg)O_4$ | 96 | Not occurred | 0 |
| Example 10 | 0.042 | 0.333 | 0.12 | 1450 | 20 | $In_2O_3$, $In(GaMg)O_4$, $MgIn_2O_4$ | 97 | Not occurred | 0 |
| Example 11 | 0.072 | 0.0001 | 0.12 | 1450 | 20 | $In_2O_3$ | 98 | Not occurred | 0 |
| Example 12 | 0.072 | 0.0005 | 0.12 | 1450 | 20 | $In_2O_3$ | 98 | Not occurred | 0 |
| Example 13 | 0.05 | 0.0001 | 0.12 | 1450 | 20 | $In_2O_3$ | 98 | Not occurred | 0 |
| Com. Ex. 1 | 0.077 | 0.461 | 2.5 | 1300 | 12 | $MgGa_2O_4$, $Ga_2O_3$ | 86 | Microarc generated | 21 |
| Com. Ex. 2 | 0.712 | 0.186 | 2 | 1400 | 12 | $In_2O_3$, $GaInO_3$, $In_2MgO_4$, $Ga_2O_3$ | 80 | Microarc generated | 12 |

Examples 14 to 18

[Production of an Oxide Semiconductor Thin Film]

The targets produced in Examples 1 to 3 and 11 and 12 were mounted in a magnetron sputtering apparatus, and slide glass (#1737, manufactured by Corning Inc.) was installed as a substrate. By the DC magnetron sputtering method, a 50 nm-thick oxide thin film was formed on slide glass under the following conditions.

At the time of film formation, an Ar gas, an $O_2$ gas and/or a $H_2O$ gas were introduced at partial pressures (%) shown in Table 2. The substrate on which a film was formed was heated in an atmosphere at 300° C. for 1 hour, whereby an oxide semiconductor film was formed.

Sputtering conditions were as follows.
Substrate temperature: 25° C.
Ultimate pressure: $8.5 \times 10^{-5}$ Pa
Atmospheric gas: Ar gas, $O_2$ gas and/or $H_2O$ gas
Sputtering pressure (total pressure): 0.4 Pa
Input power: DC 100 W
S (substrate)-T (target) distance: 70 mm

[Production of a Device for Measuring Hall Effect]

A device for measuring the hall effect was set in a Resi Test 8300 (manufactured by Toyo Technical Co., Ltd.) by using a glass substrate on which a film was formed, and the hall effect was evaluated at room temperature. The results are shown in Table 2.

Further, by an ICP-AES analysis, the atomic ratio of elements contained in the oxide thin film was confirmed to be the same as that of the sputtering target.

[Production of a Thin Film Transistor]

As the substrate, a conductive silicon substrate on which a 100 nm-thick thermally oxidized film was used. The thermally oxidized film functions as a gate insulating film and a conductive silicon part functions as a gate electrode.

On the gate insulating film, a film was formed by sputtering under the conditions shown in Table 2, whereby a 50 nm-thick oxide thin film was fabricated. As a resist, OFPR#800 (manufactured by Tokyo Ohka Kogyo Co., Ltd.) was used. Coating, pre-baking (80° C., 5 minutes) and exposure were conducted. After development, post-baking was conducted (120° C., 5 minutes), etched with oxalic acid, and patterned into a desired shape. Thereafter, the film was subjected to a heat treatment at 300° C. for 1 hour in a hot-air oven (annealing treatment).

Thereafter, by the lift-off method, Mo (100 nm) was formed into a film by sputtering, and source/drain electrodes were patterned in a desired shape. Further, as a treatment before the formation of a protective film, as shown in Table 2, the oxide semiconductor film was subjected to a nitrous oxide plasma treatment. Then, $SiN_x$ was formed into a film by the plasma CVD (PECVD) method to obtain a protective film. A contact hole was formed by using hydrofluoric acid, whereby a thin film transistor was fabricated.

For the thus fabricated thin film transistor, a field effect mobility ($\mu$), an S value and a threshold voltage (Vth) were evaluated. These values were measured by using a semiconductor parameter analyzer (4200SCS, manufactured by Keithley Instruments, Inc.) at room temperature in a light-shielding (in a shield box) environment. The drain voltage (Vd) was 10V. The results are shown in Table 2.

Comparative Examples 3 and 4

Oxide semiconductor thin films, devices for evaluating a thin film and thin film transistors were fabricated and evaluated in the same manner as in Examples 14 to 18, except that the target, the sputtering conditions and the heating (annealing) conditions were changed to those shown in Table 2. The results are shown in Table 2.

As shown in Table 2, the devices of Comparative Examples 3 and 4 had a field effect mobility of less than 10 cm²/Vs, which was significantly lower than the values in Examples 14 to 18.

TABLE 2

| | | Example 14 | Example 15 | Example 16 | Example 17 | Example 18 | Com. Ex. 3 | Com. Ex. 4 |
|---|---|---|---|---|---|---|---|---|
| Target composition | Ga/(In + Ga + Mg) | 0.05 | 0.1 | 0.1 | 0.072 | 0.072 | 0.077 | 0.712 |
| | Mg/(In + Ga + Mg) | 0.05 | 0.1 | 0.2 | 0.0001 | 0.0005 | 0.461 | 0.186 |
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 | 0.4 | 0.4 | 0.4 |
| | [$H_2O$]/([$H_2O$] + [Ar] + [$O_2$]) (%) | 1 | 2 | 0 | 1 | 1 | 0 | 0 |
| | [Ar]/([$H_2O$] + [Ar] + [$O_2$]) (%) | 99 | 98 | 85 | 99 | 98 | 55 | 55 |
| | [$O_2$]/([$H_2O$] + [Ar] + [$O_2$]) (%) | 0 | 0 | 15 | 0 | 1 | 45 | 45 |
| | Water partial pressure (Pa) | 4.0E−03 | 8.0E−03 | 0.0E+00 | 4.0E−03 | 4.0E−03 | 0.0E+00 | 0.0E+00 |
| | Sputtering method | DC | DC | DC | DC | DC | DC | DC |
| | T-S distance (mm) | 70 | 70 | 70 | 70 | 70 | 70 | 70 |
| | Film thickness (nm) | 50 | 50 | 50 | 50 | 50 | 50 | 50 |
| | Substrate temperature (° C.) | 25 | 25 | 25 | 25 | 25 | 25 | 25 |
| Annealing | Annealing temperature (° C.) | 300 | 300 | 300 | 300 | 300 | 300 | 300 |
| | Annealing time (min) | 60 | 60 | 60 | 60 | 60 | 60 | 60 |
| | Atmosphere | Air | Air | Air | Air | Air | Air | Air |
| Hall measurement | Carrier concentration (cm⁻³) | 1.57E+16 | 8.66E+15 | 6.14E+16 | 5.38E+16 | 3.22E+16 | 2.63E+14 | 8.86E+14 |
| TFT | Channel width/Channel length (μm) | 20/10 | 20/10 | 20/10 | 20/10 | 20/10 | 20/10 | 20/10 |
| | Source/drain | Mo | Mo | Mo | Mo | Mo | Mo | Mo |
| | Source/drain patterning | Lift off | Lift off | Lift off | Lift off | Lift off | Lift off | Lift off |
| | Treatment before formation of protective film | Nitrous oxide plasma | Nitrous oxide plasma | Nitrous oxide plasma | Nitrous oxide plasma | Nitrous oxide plasma | Nitrous oxide plasma | Nitrous oxide plasma |
| | Protective film | $SiN_x$ | $SiN_x$ | $SiN_x$ | $SiN_x$ | $SiN_x$ | $SiN_x$ | $SiN_x$ |
| | Mobility μ(cm²/Vs) | 23.2 | 21.9 | 20.6 | 31.7 | 30.6 | 6.5 | 9.1 |
| | Threshold voltage (V) | 0.56 | 0.68 | 0.26 | 0.09 | 0.05 | 3.3 | 3.4 |
| | S value (V/dec) | 0.25 | 0.23 | 0.31 | 0.18 | 0.20 | 1.2 | 1.6 |

Industrial Applicability

The thin film transistor of the invention can be used for a display, in particular, a large-sized display.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification of a Japanese application on the basis of which the present application claims Paris convention priority are incorporated herein by reference in its entirety.

The invention claimed is:

1. A sputtering target comprising a sintered body comprising In, Ga and Mg,
    the sintered body comprising a compound redresented by $In_2O_3$,
    the sintered body comprising one or more compounds selected from a compound represented by $In(GaMg)O_4$, a compound represented by $Ga_2MgO_4$ and a compound represented by $In_2MgO_4$, and
    having an atomic ratio In/(In+Ga+Mg) of 0.5 or more and 0.9999 or less and an atomic ratio (Ga+Mg)/(In+Ga+Mg) of 0.0001 or more and 0.5 or less.

2. The sputtering target according to claim 1, wherein the atomic ratio satisfies the following relationship:
    In/(In+Ga+Mg)=exceeding 0.7 and 0.9999 or less and
    (Ga+Mg)/(In+Ga+Mg)=0.0001 or more and less than 0.3.

3. The sputtering target according to claim 1, wherein the relative density of the sintered body is 90% or more.

4. The sputtering target according to claim 1, wherein the sintered body further comprises a positive tetravalent metal oxide M.

5. The sputtering target according to claim 4, wherein the metal oxide M is one or more oxides selected from $SnO_2$, $TiO_2$, $SiO_2$, $ZrO_2$, $GeO_2$, $HfO_2$ and $CeO_2$.

6. The sputtering target according to claim 5 which satisfies the following atomic ratio:
    [M]/[all metals]=0.0001 to 0.20
    wherein [M] is the total of the positive tetravalent metal atoms contained in the sintered body and the [all metals] is the total of all metal atoms contained in the sintered body.

7. A method for producing the sputtering target according to claim 1, comprising:
    mixing indium oxide powder having an average particle size of 0.1 to 1.2 μm, gallium oxide powder having an average particle size of 0.1 to 1.2 μm and magnesium oxide powder having an average particle size of 0.1 to 1.2 μm at an atomic ratio In/((In+Ga+Mg) of 0.5 or more and 0.9999 or less and an atomic ratio (Ga+Mg)/(In+Ga+Mg) of 0.0001 or more and 0.5 or less;
    forming the resulting mixture to obtain a formed body;
    heating the resulting formed body at a heating rate of 0.1 to 2° C./min from 800° C. to a sintering temperature; and
    sintering the formed body by holding the formed body at the sintering temperature for 10 to 50 hours;
    the sintering temperature being 1200° C. to 1650° C.

8. A method for producing an oxide thin film, wherein a film is formed by a sputtering method by using the sputtering target according to claim 1.

9. The method for producing an oxide thin film according to claim 8, wherein the film formation by a sputtering method is conducted in an atmosphere of a mixed gas comprising rare gas atoms and at least one or more selected from water molecules, oxygen molecules and nitrous oxide molecules.

10. The method for producing an oxide thin film according to claim 9, wherein the film formation by a sputtering method is conducted in an atmosphere of a mixed gas comprising rare gas atoms and at least water molecules.

11. The method for producing an oxide thin film according to claim 10, wherein the content of water molecules in the mixed gas is 0.1% to 25% in terms of partial pressure.

12. A thin film transistor comprising an oxide thin film formed by the method according to claim 8 as a channel layer.

13. The thin film transistor according to claim 12 comprising a protective film which comprises $SiN_x$ on the channel layer.

14. A display comprising the thin film transistor according to claim 12.

* * * * *

UNITED STATES PATENT AND TRADEMARK OFFICE
CERTIFICATE OF CORRECTION

| | | |
|---|---|---|
| PATENT NO. | : 9,039,944 B2 | Page 1 of 1 |
| APPLICATION NO. | : 14/130857 | |
| DATED | : May 26, 2015 | |
| INVENTOR(S) | : Kazuaki Ebata et al. | |

It is certified that error appears in the above-identified patent and that said Letters Patent is hereby corrected as shown below:

IN THE CLAIMS

Column 19, line 22, -- redresented -- should be "represented"

Signed and Sealed this
Second Day of February, 2016

Michelle K. Lee
*Director of the United States Patent and Trademark Office*